(12) United States Patent
Ekstrand

(10) Patent No.: US 9,634,647 B2
(45) Date of Patent: *Apr. 25, 2017

(54) COMPLEX-VALUED SYNTHESIS FILTER BANK WITH PHASE SHIFT

(71) Applicant: Dolby International AB, Amsterdam Zuidoost (NL)

(72) Inventor: Per Ekstrand, Saltsjobaden (SE)

(73) Assignee: Dolby International AB, Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/364,384

(22) Filed: Nov. 30, 2016

(65) Prior Publication Data

US 2017/0085250 A1 Mar. 23, 2017

Related U.S. Application Data

(60) Division of application No. 14/810,174, filed on Jul. 27, 2015, which is a continuation of application No.
(Continued)

(30) Foreign Application Priority Data

Feb. 18, 2009 (SE) ........................................ 0900217

(51) Int. Cl.
*G06F 17/11* (2006.01)
*H03H 17/02* (2006.01)
*H04R 3/04* (2006.01)

(52) U.S. Cl.
CPC ......... *H03H 17/0266* (2013.01); *G06F 17/11* (2013.01); *H04R 3/04* (2013.01)

(58) Field of Classification Search
None
See application file for complete search history.

(56) References Cited

U.S. PATENT DOCUMENTS 4,799,179 A 1/1989 Masson
5,436,940 A 7/1995 Nguyen
(Continued)

FOREIGN PATENT DOCUMENTS

EP 0874458 10/1998
EP 1 374 399 10/2002
(Continued)

OTHER PUBLICATIONS

Alhava, J. et al. "Prototype Filter Design for Arbitrary Delay Exponentially-Modulated Filter Bank" ISCCSP 3rd International Symposium on Communications, Control and Signal Processing, Mar. 12-14, 2008, pp. 1111-1114.
(Continued)

*Primary Examiner* — Michael D Yaary

(57) ABSTRACT

An apparatus for generating real-valued output audio samples is disclosed. The apparatus includes a memory that stores complex-valued input subband samples, real-valued demodulated samples, and the real-valued output audio samples. The apparatus also incudes a phase shifter that shifts a phase of the complex-valued input subband samples by an amount equal to a previously added phase shift and a complex-valued synthesis filter bank that generates the real-valued output audio samples in response to the complex-valued input subband samples, the real-valued demodulated samples, and prototype filter coefficients.

18 Claims, 5 Drawing Sheets

Related U.S. Application Data

14/306,495, filed on Jun. 17, 2014, now Pat. No. 9,449,608, which is a continuation of application No. 13/201,572, filed as application No. PCT/EP2010/051993 on Feb. 17, 2010, now Pat. No. 8,880,572.

(60) Provisional application No. 61/257,105, filed on Nov. 2, 2009.

(56) References Cited

U.S. PATENT DOCUMENTS

| | | | |
|---|---|---|---|
| 5,610,944 | A | 3/1997 | Mau |
| 6,236,731 | B1 | 5/2001 | Schneider |
| 7,242,710 | B2 | 7/2007 | Ekstrand |
| 7,369,989 | B2 | 5/2008 | Absar |
| 7,447,631 | B2 | 11/2008 | Truman |
| 2002/0023116 | A1* | 2/2002 | Kikuchi ............... G06F 17/147 708/402 |
| 2003/0016772 | A1* | 1/2003 | Ekstrand ............ H03H 17/0266 375/350 |
| 2003/0225808 | A1 | 12/2003 | Efland |
| 2003/0233234 | A1* | 12/2003 | Truman ................ G10L 21/038 704/203 |
| 2005/0160126 | A1* | 7/2005 | Bruhn ................... G10L 19/008 708/322 |

FOREIGN PATENT DOCUMENTS

| | | |
|---|---|---|
| EP | 1410687 | 4/2004 |
| JP | 2001-007769 | 1/2001 |
| KR | 10-2005-0071604 | 7/2005 |
| KR | 2008-0095867 | 10/2008 |
| RU | 2125764 | 1/1999 |
| RU | 2145464 | 2/2000 |
| RU | 2297049 | 4/2007 |
| WO | 98/57436 | 12/1998 |
| WO | 2008/049589 | 5/2008 |

OTHER PUBLICATIONS

Brandenburg, Karlheinz "Introduction to Perceptual Coding" AES Collected Papers on Digital Audio Bitrar Reduction, Mar. 1996, pp. 23-30.
Cruz-Roldan, F. et al "Efficient Implementation of Nearly Perfect Reconstruction FIR Cosine-Modulated =Filterbanks" IEEE Transactions on Signal Processing, vol. 52, Issue 9, published in Sep. 2004, pp. 2661-2664.
Dam, H.H. et al "Iterative Method for the Design of DFT Filter Bank" Circuits and Systems II: IEEE Transactions on Express Briefs, vol. 51, Issue 11, published in Nov. 2004, pp. 581-586.
Dam, H.H. et al "Uniform DFT Filter Bank with Finite Precision Prototype Filters" APCCAS 2006, IEEE on Asia Pacific conference, Dec. 7, 2006, pp. 816-819.
Ferreira, et al., "An Efficient 20 Band Digital Audio Equalizer" presented at the AES 98th Convention, Feb. 25-28, 1995.
Gilloire, et al., "Adaptive Filtering in Subbands With Critical Sampling: Analysis, Experiments, and Application to Acoustic Echo Cancellation" IEEE Transactions on Signal Processing, vol. 40, No. 8, Aug. 1992, pp. 1862-1875.
Grbic, et al., "Design of Oversampled Uniform DFT Filter Banks with Reduced Inband Aliasing and Delay Constraints" Signal Processing and Its Applications, Sixth International, Symposium in Kuala Lumpur, MY, Aug. 13-16, 2001; vol. 1, pp. 104-107.
Haan, et al., "Filter Band Design for Subband Adaptive Microphone Arrays" IEEE Transactions on Speech and Audio Processing vol. 11, No. 1, Jan. 1, 2003, p. 14-21.
Harteneck, M. et al "Design of Near Perfect Reconstruction Oversampled Filter Banks for Subband Adaptive Filters" IEEE Transactions on Circuits and Systems II: Analog and Digital Signal Processing, vol. 46, Issue 8, Aug. 1999, pp. 1081-1085.
Kumatani, K. et al "Filter Bank Design Based on Minimization of Individual Aliasing Terms for Minimum Mutual Information Subband Adaptive Beamforming" Acoustics, Speech and Signal Processing, 2008, International Conference on IEEE, Apr. 4, 2008, pp. 1609-1612.
Lim, Yong-Ching, et al "A Width-Recursive Depth-First Tree Search Approach for the Design of Discrete Coefficient Perfect Reconstruction Lattice Filter Bank" IEEE Transactions on Circuits and Systems II: Analog and Digital Signal Processing, vol. 50, Issue 6, published in Jun. 2003, pp. 257-266.
Malvar, Henrique S., "Lapped Transforms for Efficient Transform/Subband Coding" IEEE Transactions on Acoustics, Speech, and Signal Processing, vol. 38, No. 6, Jun. 1990, p. 969-978.
Nayebi, et al., "Low Delay Fir Filter Banks: Design and Evaluation" IEEE Transactions on Signal Processing, IEEE Service Center, New York, USA, vol. 42, No. 1, Jan. 1, 1994, pp. 24-31.
Nayebi, et al., "Time-Domain Filter Bank Analysis: A New Design Theory" IEEE Transactions on Signal Processing vol. 40, No. 6, Jun. 1992, pp. 1412-1429.
Press, et al., "Numerical Recipes in C: The Art of Scientific Computing, Second Edition" Cambridge University Press, NY, 1992.
Schuller, G. et al "A New Algorithm for Efficient Low Delay Filter Bank Design" Acoustic, Speech, and Signal Processing, International Conference on ICASSP, vol. 2, pp. 1472-1475, May 1995.
Schuller, Von Gerald, "Low Delay Filter Banks with Perfect Reconstruction" Frequenz, Schiele Und Schon, Berlin, DE, vol. 50, No. 9/10, Sep. 1, 1996, pp. 228-236.
Vaidyanathan, P.P., "Multirate Systems and Filter Banks" Prentice Hall Signal Processing Series Alan V. Oppenheim Series Editor, 1993.
Velasquez, S.R. et al "Design of Hybrid Filter Banks for Analog/Digital Conversion" IEEE Transactions on Signal Processing, vol. 46, No. 4, pp. 956-967, Apr. 1998.
Wysocka-Schillak, Felicja, "Design of Low-Delay Cosine-Modulated Filter Banks with Equiripple Reconstruction Error" Signals and Electronic Systems, 2008, Krakow, Sep. 14-17, 2008, pp. 335-338.
Xu, H. et al "Efficient Iterative Design Method for Cosine-Modulated QMF Banks" IEEE Transactions on Signal Processing, vol. 44, Issue 7, Jul. 1996, pp. 1657-1668.

* cited by examiner (a)

(b)

(a)

(b)

COMPLEX-VALUED SYNTHESIS FILTER BANK WITH PHASE SHIFT

This application is a divisional application of U.S. patent application Ser. No. 14/810,174 filed Jul. 27, 2015, which is a continuation of U.S. patent application Ser. No. 14/306,495 filed on Jun. 17, 2014, now U.S. Pat. No. 9,449,608 which is a continuation of U.S. patent application Ser. No. 13/201,572 filed on Aug. 15, 2011 now U. S. Pat. No. 8,880,572 issued on Nov. 4, 2014, which is a national application of PCT application PCT/EP2010/051993 filed on Feb. 17, 2010 which claims the benefit of the filing date of U.S. Provisional Patent Application Ser. No. 61/257,105 filed on Nov. 2, 2009 and Sweden application 0900217-1 filed on Feb. 18, 2009, all of which are hereby incorporated by reference.

The present document relates to modulated sub-sampled digital filter banks, as well as to methods and systems for the design of such filter banks. In particular, it provides a new design method and apparatus for a near-perfect reconstruction low delay cosine or complex-exponential modulated filter bank, optimized for suppression of aliasing emerging from modifications of the spectral coefficients or subband signals. Furthermore, a specific design for a 64 channel filter bank using a prototype filter length of 640 coefficients and a system delay of 319 samples is given.

The teachings of this document may be applicable to digital equalizers, as outlined e.g. in "An Efficient 20 Band Digital Audio Equalizer" A. J. S. Ferreira, J. M. N. Viera, AES preprint, 98$^{th}$ Convention 1995 February 25-28 Paris, N.Y., USA; adaptive filters, as outlined e.g. in Adaptive Filtering in Subbands with Critical Sampling: Analysis, Experiments, and Application to Acoustic Echo Cancellation" A. Gilloire, M. Vetterli, IEEE Transactions on Signal Processing, vol. 40, no. 8, August, 1992; multiband companders; and to audio coding systems utilizing high frequency reconstruction (HFR) methods; or audio coding systems employing so-called parametric stereo techniques. In the two latter examples, a digital filter bank is used for the adaptive adjustment of the spectral envelope of the audio signal. An exemplary HFR system is the Spectral Band Replication (SBR) system outlined e.g. in WO 98/57436, and a parametric stereo system is described e.g. in EP1410687.

Throughout this disclosure including the claims, the expressions "subband signals" or "subband samples" denote the output signal or output signals, or output sample or output samples from the analysis part of a digital filter bank or the output from a forward transform, i.e. the transform operating on the time domain data, of a transform based system. Examples for the output of such forward transforms are the frequency domain coefficients from a windowed digital Fourier transform (DFT) or the output samples from the analysis stage of a modified discrete cosine transform (MDCT).

Throughout this disclosure including the claims, the expression "aliasing" denotes a non-linear distortion resulting from decimation and interpolation, possibly in combination with modification (e.g. attenuation or quantization) of the subband samples in a sub-sampled digital filter bank.

A digital filter bank is a collection of two or more parallel digital filters. The analysis filter bank splits the incoming signal into a number of separate signals named subband signals or spectral coefficients. The filter bank is critically sampled or maximally decimated when the total number of subband samples per unit time is the same as that for the input signal. A so called synthesis filter bank combines the subband signals into an output signal. A popular type of critically sampled filter banks is the cosine modulated filter bank, where the filters are obtained by cosine modulation of a low-pass filter, a so-called prototype filter. The cosine modulated filter bank offers effective implementations and is often used in natural audio coding systems. For further details, reference is made to "Introduction to Perceptual Coding" K. Brandenburg, AES, Collected Papers on Digital Audio Bitrate Reduction, 1996.

A common problem in filter bank design is that any attempt to alter the subband samples or spectral coefficients, e.g. by applying an equalizing gain curve or by quantizing the samples, typically renders aliasing artifacts in the output signal. Therefore, filter bank designs are desirable which reduce such artifacts even when the subband samples are subjected to severe modifications.

A possible approach is the use of oversampled, i.e. not critically sampled, filter banks. An example of an oversampled filter bank is the class of complex exponential modulated filter banks, where an imaginary sine modulated part is added to the real part of a cosine modulated filter bank. Such a complex exponential modulated filter bank is described in EP1374399 which is incorporated herewith by reference.

One of the properties of the complex exponential modulated filter banks is that they are free from the main alias terms present in the cosine modulated filter banks. As a result, such filter banks are typically less prone to artifacts induced by modifications to the subband samples. Nevertheless, other alias terms remain and sophisticated design techniques for the prototype filter of such a complex exponential modulated filter bank should be applied in order to minimize the impairments, such as aliasing, emerging from modifications of the subband signals. Typically, the remaining alias terms are less significant than the main alias terms.

A further property of filter banks is the amount of delay which a signal incurs when passing through such filter banks. In particular for real time applications, such as audio and video streams, the filter or system delay should be low. A possible approach to obtain a filter bank having a low total system delay, i.e. a low delay or latency of a signal passing through an analysis filter bank followed by a synthesis filter bank, is the use of short symmetric prototype filters. Typically, the use of short prototype filters leads to relatively poor frequency band separation characteristics and to large frequency overlap areas between adjacent subbands. By consequence, short prototype filters usually do not allow for a filter bank design that suppresses the aliasing adequately when modifying the subband samples and other approaches to the design of low delay filter banks are required.

It is therefore desirable to provide a design method for filter banks which combine a certain number of desirable properties. Such properties are a high level of insusceptibility to signal impairments, such as aliasing, subject to modifications of the subband signals; a low delay or latency of a signal passing through the analysis and synthesis filter banks; and a good approximation of the perfect reconstruction property. In other words, it is desirable to provide a design method for filter banks which generate a low level of errors. Sub-sampled filter banks typically generate two types of errors, linear distortion from the pass-band term which further can be divided into amplitude and phase errors, and non-linear distortion emerging from the aliasing terms. Even though a "good approximation" of the PR (perfect reconstruction) property would keep all of these errors on a low level, it may be beneficial from a perceptual point of view to put a higher emphasis on the reduction of distortions caused by aliasing.

Furthermore, it is desirable to provide a prototype filter which can be used to design an analysis and/or synthesis filter bank which exhibits such properties. It is a further desirable property of a filter bank to exhibit a near constant group delay in order to minimize artifacts due to phase dispersion of the output signal.

The present document shows that impairments emerging from modifications of the subband signals can be significantly reduced by employing a filter bank design method, referred to as improved alias term minimization (IATM) method, for optimization of symmetric or asymmetric prototype filters.

The present document teaches that the concept of pseudo QMF (Quadrature Mirror Filter) designs, i.e. near perfect reconstruction filter bank designs, may be extended to cover low delay filter bank systems employing asymmetric prototype filters. As a result near perfect reconstruction filter banks with a low system delay, low susceptibility to aliasing and/or low level of pass band errors including phase dispersion can be designed. Depending on the particular needs, the emphasis put on either one of the filter bank properties may be changed. Hence, the filter bank design method according to the present document alleviates the current limitations of PR filter banks used in an equalization system or other system modifying the spectral coefficients.

The design of a low delay complex-exponential modulated filter bank according to the present document may comprise the steps:

a design of an asymmetric low-pass prototype filter with a cutoff frequency of π/2M, optimized for desired aliasing and pass band error rejections, further optimized for a system delay D; M being the number of channels of the filter bank; and a construction of an M-channel filter bank by complex-exponential modulation of the optimized prototype filter.

Furthermore, the operation of such a low delay complex-exponential modulated filter bank according to the present document may comprise the steps:

a filtering of a real-valued time domain signal through the analysis part of the filter bank;

a modification of the complex-valued subband signals, e.g. according to a desired, possibly time-varying, equalizer setting;

a filtering of the modified complex-valued subband samples through the synthesis part of the filter bank; and a computation of the real part of the complex-valued time domain output signal obtained from the synthesis part of the filter bank.

In addition to presenting a new filter design method, the present document describes a specific design of a 64 channel filter bank having a prototype filter length of 640 coefficients and a system delay of 319 samples.

The teachings of the present document, notably the proposed filter bank and the filter banks designed according to the proposed design method may be used in various applications. Such applications are the improvement of various types of digital equalizers, adaptive filters, multiband companders and adaptive envelope adjusting filter banks used in HFR or parametric stereo systems.

According to a first aspect, a method for determining N coefficients of an asymmetric prototype filter $p_0$ for usage for building an M-channel, low delay, subsampled analysis/synthesis filter bank is described. The analysis/synthesis filter bank may comprise M analysis filters $h_k$ and M synthesis filters $f_k$, wherein k takes on values from 0 to M−1 and wherein typically M is greater than 1. The analysis/synthesis filter bank has an overall transfer function, which is typically associated with the coefficients of the analysis and synthesis filters, as well as with the decimation and/or interpolation operations.

The method comprises the step of choosing a target transfer function of the filter bank comprising a target delay D. Typically a target delay D which is smaller or equal to N is selected. The method comprises further the step of determining a composite objective function $e_{tot}$ comprising a pass band error term $e_t$ and an aliasing error term $e_a$. The pass band error term is associated with the deviation between the transfer function of the filter bank and the target transfer function, and the aliasing error term $e_a$ is associated with errors incurred due to the subsampling, i.e. decimation and/or interpolation of the filter bank. In a further method step, the N coefficients of the asymmetric prototype filter $p_0$ are determined that reduce the composite objective function $e_{tot}$.

Typically, the step of determining the objective error function $e_{tot}$ and the step of determining the N coefficients of the asymmetric prototype filter $p_0$ are repeated iteratively, until a minimum of the objective error function $e_{tot}$ is reached. In other words, the objective function $e_{tot}$ is determined on the basis of a given set of coefficients of the prototype filter, and an updated set of coefficients of the prototype filter is generated by reducing the objective error function. This process is repeated until no further reductions of the objective function may be achieved through the modification of the prototype filter coefficients. This means that the step of determining the objective error function $e_{tot}$ may comprise determining a value for the composite objective function $e_{tot}$ for given coefficients of the prototype filter $p_0$ and the step of determining the N coefficients of the asymmetric prototype filter $p_o$ may comprise determining updated coefficients of the prototype filter $p_o$ based on the gradient of the composite objective function $e_{tot}$ associated with the coefficients of the prototype filter $p_0$.

According to a further aspect, the composite objective error function $e_{tot}$ is given by:

$$e_{tot}(\alpha) = \alpha e_t + (1-\alpha) e_a,$$

with $e_t$ being the pass band error term, $e_a$ being the aliasing error term and α being a weighting constant taking on values between 0 and 1. The pass band error term $e_t$ may be determined by accumulating the squared deviation between the transfer function of the filter bank and the target transfer function for a plurality of frequencies. In particular, the pass band error term $e_t$ may be calculated as $$e_t = \frac{1}{2\pi} \int_{-\pi}^{\pi} \left| \frac{1}{2}(A_0(e^{j\omega}) + A_0^*(e^{-j\omega})) - P(\omega)e^{-j\omega D} \right|^2 d\omega,$$

with $P(\omega)e^{-j\omega D}$ being the target transfer function, and $$A_0(z) = \sum_{k=0}^{M-1} H_k(z)F_k(z),$$

wherein $H_k(z)$ and $F_k(z)$ are the z-transforms of the analysis and synthesis filters $h_k(n)$ and $f_k(n)$, respectively.

The aliasing error term $e_a$ is determined by accumulating the squared magnitude of alias gain terms for a plurality of frequencies. In particular, the aliasing error term $e_a$ is calculated as $$e_a = \frac{1}{2\pi} \sum_{l=1}^{M-1} \int_{-\pi}^{\pi} |\tilde{A}_l(e^{j\omega})|^2 d\omega,$$

with $\tilde{A}_l(z) = \frac{1}{2}(A_l(z) + A_{M-l}*(z))$, $l = 1 \ldots M - 1$, for $z = e^{j\omega}$ and with $$A_l(z) = \sum_{k=0}^{M-1} H_k(zW^l) F_k(z)$$

being the $l^{th}$ alias gain term evaluated on the unit circle with $W = e^{-i2\pi/M}$, wherein $H_k(z)$ and $F_k(z)$ are the z-transforms of the analysis and synthesis filters $h_k(n)$ and $f_k(n)$, respectively. The notation $A_l^*(z)$ is the z-transform of the complex-conjugated sequence $a_l(n)$.

According to a further aspect, the step of determining a value for the composite objective function $e_{tot}$ may comprise generating the analysis filters $h_k(n)$ and the synthesis filters $f_k(n)$ of the analysis/synthesis filter bank based on the prototype filter $p_0(n)$ using cosine modulation, sine modulation and/or complex-exponential modulation. In particular, the analysis and synthesis filters may be determined using cosine modulation as $$h_k(n) = \sqrt{2}\, p_0(n) \cos\left\{\frac{\pi}{M}\left(k + \frac{1}{2}\right)\left(n - \frac{D}{2} \mp \frac{M}{2}\right)\right\},$$

with $n = 0 \ldots N-1$, for the M analysis filters of the analysis filter bank and;

$$f_k(n) = \sqrt{2}\, p_0(n) \cos\left\{\frac{\pi}{M}\left(k + \frac{1}{2}\right)\left(n - \frac{D}{2} \pm \frac{M}{2}\right)\right\},$$

with $n = 0 \ldots N-1$, for the M synthesis filters of the synthesis filter bank.

The analysis and synthesis filters may also be determined using complex exponential modulation as $$h_k(n) = p_0(n) \exp\left\{i\frac{\pi}{M}\left(k + \frac{1}{2}\right)\left(n - \frac{D}{2} - A\right)\right\},$$

with $n = 0 \ldots N-1$, and A being an arbitrary constant, for the M analysis filters of the analysis filter bank and;

$$f_k(n) = p_0(n) \exp\left\{i\frac{\pi}{M}\left(k + \frac{1}{2}\right)\left(n - \frac{D}{2} + A\right)\right\},$$

with $n = 0 \ldots N-1$, for the M synthesis filters of the synthesis filter bank.

According to another aspect, the step of determining a value for the composite objective function $e_{tot}$ may comprise setting at least one of the filter bank channels to zero. This may be achieved by applying zero gain to at least one analysis and/or synthesis filter, i.e. the filter coefficients $h_k$ and/or $f_k$ may be set to zero for at least one channel k. In an example a predetermined number of the low frequency channels and/or a predetermined number of the high frequency channels may be set to zero. In other words, the low frequency filter bank channels $k=0$ up to $C_{low}$; with $C_{low}$ greater than zero may be set to zero. Alternatively or in addition, the high frequency filter bank channels $k=C_{high}$ up to $M-1$, with $C_{high}$ smaller than $M-1$ may be set to zero.

In such a case, the step of determining a value for the composite objective function $e_{tot}$ may comprise generating the analysis and synthesis filters for the aliasing terms $C_{low}$ and $M-C_{low}$ and/or $C_{high}$ and $M-C_{high}$ using complex exponential modulation. It may further comprise generating the analysis and synthesis filters for the remaining aliasing terms using cosine modulation. In other words, the optimization procedure may be done in a partially complex-valued manner, where the aliasing error terms which are free from main aliasing are calculated using real valued filters, e.g. filters generated using cosine modulation, and where the aliasing error terms which carry the main aliasing in a real-valued system are modified for complex-valued processing, e.g. using complex exponential modulated filters.

According to a further aspect, the analysis filter bank may generate M subband signals from an input signal using the M analysis filters $h_k$. These M subband signals may be decimated by a factor M, yielding decimated subband signals. Typically, the decimated subband signals are modified, e.g. for equalization purposes or for compression purposes. The possibly modified decimated subband signals may be upsampled by a factor M and the synthesis filter bank may generate an output signal from the upsampled decimated subband signals using the M synthesis filters $f_k$.

According to another aspect, an asymmetric prototype filter $p_0(n)$ comprising coefficients derivable from the coefficients of Table 1 by any of the operations of rounding, truncating, scaling, subsampling or oversampling is described. Any combination of the operations rounding, truncating, scaling, subsampling or oversampling are possible.

The rounding operation of the filter coefficients may comprise any one of the following: rounding to more than 20 significant digits, more than 19 significant digits, more than 18 significant digits, more than 17 significant digits, more than 16 significant digits, more than 15 significant digits, more than 14 significant digits, more than 13 significant digits, more than 12 significant digits, more than 11 significant digits, more than 10 significant digits, more than 9 significant digits, more than 8 significant digits, more than 7 significant digits, more than 6 significant digits, more than 5 significant digits, more than 4 significant digits, more than 3 significant digits, more than 2 significant digits, more than 1 significant digits, 1 significant digit.

The truncating operation of the filter coefficients may comprise any one of the following: truncating to more than 20 significant digits, more than 19 significant digits, more than 18 significant digits, more than 17 significant digits, more than 16 significant digits, more than 15 significant digits, more than 14 significant digits, more than 13 significant digits, more than 12 significant digits, more than 11 significant digits, more than 10 significant digits, more than 9 significant digits, more than 8 significant digits, more than 7 significant digits, more than 6 significant digits, more than 5 significant digits, more than 4 significant digits, more than 3 significant digits, more than 2 significant digits, more than 1 significant digits, 1 significant digit.

The scaling operation of the filter coefficient may comprise up-scaling or down-scaling of the filter coefficients. In particular, it may comprise up- and/or down-scaling scaling by the number M of filter bank channels. Such up- and/or down-scaling may be used to maintain the input energy of an input signal to the filter bank at the output of the filter bank.

The subsampling operation may comprise subsampling by a factor less or equal to 2, less or equal to 3, less or equal to 4, less or equal to 8, less or equal to 16, less or equal to 32, less or equal to 64, less or equal to 128, less or equal to 256. The subsampling operation may further comprise the determination of the subsampled filter coefficients as the mean value of adjacent filter coefficient. In particular, the mean value of R adjacent filter coefficients may be determined as the subsampled filter coefficient, wherein R is the subsampling factor.

The oversampling operation may comprise oversampling by a factor less or equal to 2, less or equal to 3, less or equal to 4, less or equal to 5, less or equal to 6, less or equal to 7, less or equal to 8, less or equal to 9, less or equal to 10. The oversampling operation may further comprise the determination of the oversampled filter coefficients as the interpolation between two adjacent filter coefficients.

According to a further aspect, a filter bank comprising M filters is described. The filters of this filter bank are based on the asymmetric prototype filters described in the present document and/or the asymmetric prototype filters determined via the methods outlined in the present document. In particular, the M filters may be modulated version of the prototype filter and the modulation may be a cosine modulation, sine modulation and/or complex-exponential modulation.

According to another aspect, a method for generating decimated subband signals with low sensitivity to aliasing emerging from modifications of said subband signals is described. The method comprises the steps of determining analysis filters of an analysis/synthesis filter bank according to methods outlined in the present document; filtering a real-valued time domain signal through said analysis filters, to obtain complex-valued subband signals; and decimating said subband signals.

Furthermore, a method for generating a real valued output signal from a plurality of complex-valued subband signals with low sensitivity to aliasing emerging from modifications of said subband signals is described. The method comprises the steps of determining synthesis filters of an analysis/synthesis filter bank according to the methods outlined in the present document; interpolating said plurality of complex-valued subband signals; filtering said plurality of interpolated subband signals through said synthesis filters; generating a complex-valued time domain output signal as the sum of the signals obtained from said filtering; and taking the real part of the complex-valued time domain output signal as the real-valued output signal.

According to another aspect, a system operative of generating subband signals from a time domain input signal are described, wherein the system comprises an analysis filter bank which has been generated according to methods outlined in the present document and/or which is based on the prototype filters outlined in the present document.

According to another aspect, an apparatus for generating real-valued output audio samples is disclosed. The apparatus includes a memory that stores complex-valued input subband samples, real-valued demodulated samples, and the real-valued output audio samples. The apparatus also includes a a phase shifter that shifts a phase of the complex-valued input subband samples by an amount equal to a previously added phase shift and a complex-valued synthesis filter bank that generates the real-valued output audio samples in response to the complex-valued input subband samples, the real-valued demodulated samples, and prototype filter coefficients. The complex-valued synthesis filter bank shifts a first subset of the real-valued demodulated samples in the memory, multiplies the complex-valued input subband samples by a complex-valued exponential modulation matrix to generate complex-valued demodulated samples, stores the real part of the complex-valued demodulated samples in the memory as a second subset of the real-valued demodulated samples, extracts a third subset of the real-valued demodulated samples from the memory, multiplies the third subset of the real-valued demodulated samples by the prototype filter coefficients to generate windowed samples, combines the windowed samples to generate the real-valued output audio samples, and stores the real-valued output audio samples in the memory.

It should be noted that the aspects of the methods and systems including its preferred embodiments as outlined in the present patent application may be used stand-alone or in combination with the other aspects of the methods and systems disclosed in this document. Furthermore, all aspects of the methods and systems outlined in the present patent application may be arbitrarily combined. In particular, the features of the claims may be combined with one another in an arbitrary manner.

The present invention will now be described by way of illustrative examples, not limiting the scope, with reference to the accompanying drawings, in which.

It should be understood that the present teachings are applicable to a range of implementations that incorporate digital filter banks other than those explicitly mentioned in this patent. In particular, the present teachings may be applicable to other methods for designing a filter bank on the basis of a prototype filter.

In the following, the overall transfer function of an analysis/synthesis filter bank is determined. In other words, the mathematical representation of a signal passing through such a filter bank system is described. A digital filter bank is a collection of M, M being two or more, parallel digital filters that share a common input or a common output. For details on such filter banks, reference is made to "Multirate Systems and Filter Banks" P. P. Vaidyanathan Prentice Hall: Englewood Cliffs, N.J., 1993. When sharing a common input the filter bank may be called an analysis bank. The analysis bank splits the incoming signal into M separate signals called subband signals. The analysis filters are denoted $H_k(z)$, where k =0, . . . , M−1. The filter bank is critically sampled or maximally decimated when the subband signals are decimated by a factor M. Thus, the total number of subband samples per time unit across all subbands is the same as the number of samples per time unit for the input signal. The synthesis bank combines these subband signals into a common output signal. The synthesis filters are denoted $F_k(z)$, for k=0, ..., M-1.

Figure 1:
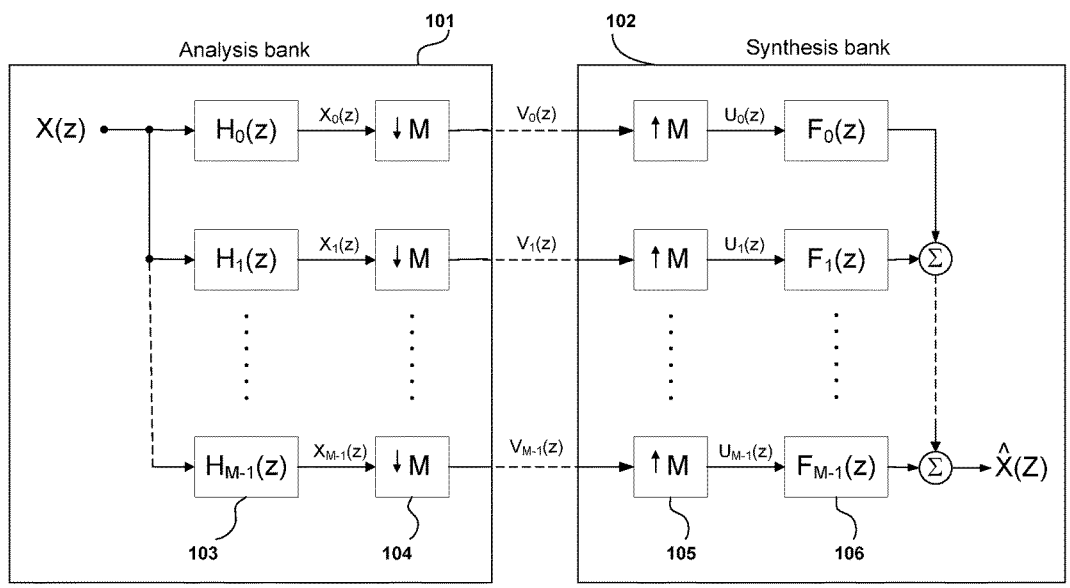
FIG. 1 illustrates the analysis and synthesis sections of a digital filter bank.

A maximally decimated filter bank with M channels or subbands is shown in FIG. 1. The analysis part 101 produces from the input signal X(z) the subband signals $V_k(z)$, which constitute the signals to be transmitted, stored or modified. The synthesis part 102 recombines the signals $V_k(z)$ to the output signal $\hat{X}(z)$.

The recombination of $V_k(z)$ to obtain the approximation $\hat{X}(z)$ of the original signal X(z) is subject to several potential errors. The errors may be due to an approximation of the perfect reconstruction property, and includes non-linear impairments due to aliasing, which may be caused by the decimation and interpolation of the subbands. Other errors resulting from approximations of the perfect reconstruction property may be due to linear impairments such as phase and amplitude distortion.

Following the notations of FIG. 1, the outputs of the analysis filters $H_k(z)$ 103 are $$X_k(z) = H_k(z)X(z), \tag{1}$$

where k=0, ..., M-1. The decimators 104, also referred to as down-sampling units, give the outputs $$V_k(z) = \frac{1}{M}\sum_{l=0}^{M-1} X_k(z^{1/M}W^l) = \frac{1}{M}\sum_{l=0}^{M-1} H_k(z^{1/M}W^l)X(z^{1/M}W^l), \tag{2}$$

where $W=e^{-i2\pi/M}$. The outputs of the interpolators 105, also referred to as up-sampling units, are given by $$U_k(z) = V_k(z^M) = \frac{1}{M}\sum_{l=0}^{M-1} H_k(zW^l)X(zW^l), \tag{3}$$

and the sum of the signals obtained from the synthesis filters 106 can be written as $$\hat{X}(z) = \sum_{k=0}^{M-1} F_k(z)U_k(z) = \sum_{k=0}^{M-1} F_k(z)\frac{1}{M}\sum_{l=0}^{M-1} H_k(zW^l)X(zW^l) = $$

$$\frac{1}{M}\sum_{l=0}^{M-1} X(zW^l)\sum_{k=0}^{M-1} H_k(zW^l)F_k(z) = \frac{1}{M}\sum_{l=0}^{M-1} X(zW^l)A_l(z) \tag{4}$$

where $$A_l(z) = \sum_{k=0}^{M-1} H_k(zW^l)F_k(z) \tag{5}$$

is the gain for the $l^{th}$ alias term $X(zW^l)$. Eq.(4) shows that $\hat{X}(z)$ is a sum of M components consisting of the product of the modulated input signal $X(zW^l)$ and the corresponding alias gain term $A_l(z)$. Eq.(4) can be rewritten as $$\hat{X}(z) = \frac{1}{M}\left\{X(z)A_0(z) + \sum_{l=1}^{M-1} X(zW^l)A_l(z)\right\}. \tag{6}$$

The last sum on the right hand side (RHS) constitutes the sum of all non-wanted alias terms. Canceling all aliasing, that is forcing this sum to zero by means of proper choices of $H_k(z)$ and $F_k(z)$, gives $$\hat{X}(z) = \frac{1}{M}X(z)A_0(z) = \frac{1}{M}X(z)\sum_{k=0}^{M-1} H_k(z)F_k(z) = X(z)T(z), \tag{7}$$

where $$T(z) = \frac{1}{M}\sum_{k=0}^{M-1} H_k(z)F_k(z) \tag{8}$$

is the overall transfer function or distortion function. Eq.(8) shows that, depending on $H_k(z)$ and $F_k(z)$, T(z) could be free from both phase distortion and amplitude distortion. The overall transfer function would in this case simply be a delay of D samples with a constant scale factor c, i.e.

$$T(z) = cz^{-D}, \tag{9}$$

which substituted into Eq.(7) gives $$\hat{X}(z) = cz^{-D}X(z). \tag{10}$$

The type of filters that satisfy Eq.(10) are said to have the perfect reconstruction (PR) property. If Eq.(10) is not perfectly satisfied, albeit satisfied approximately, the filters are of the class of approximate perfect reconstruction filters.

In the following, a method for designing analysis and synthesis filter banks from a prototype filter is described. The resulting filter banks are referred to as cosine modulated filter banks. In the traditional theory for cosine modulated filter banks, the analysis filters $h_k(n)$ and synthesis filters $f_k(n)$ are cosine modulated versions of a symmetric low-pass prototype filter $p_0(n)$, i.e.

$$h_k(n) = \sqrt{2}\, p_0(n)\cos\left\{\frac{\pi}{M}\left(k+\frac{1}{2}\right)\left(n-\frac{N}{2}\mp\frac{M}{2}\right)\right\}, \tag{11}$$

$$0 \le n \le N, 0 \le k < M$$

$$f_k(n) = \sqrt{2}\, p_0(n)\cos\left\{\frac{\pi}{M}\left(k+\frac{1}{2}\right)\left(n-\frac{N}{2}\pm\frac{M}{2}\right)\right\}, \tag{12}$$

$$0 \le n \le N, 0 \le k < M$$

respectively, where M is the number of channels of the filter bank and N is the prototype filter order.

The above cosine modulated analysis filter bank produces real-valued subband samples for real-valued input signals. The subband samples are down sampled by a factor M, making the system critically sampled. Depending on the choice of the prototype filter, the filter bank may constitute an approximate perfect reconstruction system, i.e. a so called pseudo QMF bank described e.g. in U.S. Pat. No. 5,436,940, or a perfect reconstruction (PR) system. An example of a PR system is the modulated lapped transform (MLT) described in further detail in "Lapped Transforms for Efficient Transform/Subband Coding" H.S. Malvar, IEEE Trans ASSP, vol. 38, no. 6, 1990. The overall delay, or system delay, for a traditional cosine modulated filter bank is N.

In order to obtain filter bank systems having lower system delays, the present document teaches to replace the symmetric prototype filters used in conventional filter banks by asymmetric prototype filters. In the prior art, the design of asymmetric prototype filters has been restricted to systems having the perfect reconstruction (PR) property. Such a perfect reconstruction system using asymmetric prototype filters is described in EP0874458. However, the perfect reconstruction constraint imposes limitations to a filter bank used in e.g. an equalization system, due to the restricted degrees of freedom when designing the prototype filter. It should be noted that symmetric prototype filters have a linear phase, i.e. they have a constant group delay across all frequencies. On the other hand, asymmetric filters typically have a non-linear phase, i.e. they have a group delay which may change with frequency.

In filter bank systems using asymmetric prototype filters, the analysis and synthesis filters may be written as $$h_k(n) = \sqrt{2}\,\hat{h}_0(n)\cos\left\{\frac{\pi}{M}\left(k+\frac{1}{2}\right)\left(n-\frac{D}{2}\mp\frac{M}{2}\right)\right\}, \quad (13)$$
$$0 \le n \le N_h, 0 \le k < M$$

$$f_k(n) = \sqrt{2}\,\hat{f}_0(n)\cos\left\{\frac{\pi}{M}\left(k+\frac{1}{2}\right)\left(n-\frac{D}{2}\pm\frac{M}{2}\right)\right\}, \quad (14)$$
$$0 \le n \le N_f, 0 \le k < M$$

respectively, where $\hat{h}_0(n)$ and $\hat{f}_0(n)$ are the analysis and synthesis prototype filters of lengths $N_h$ and $N_f$, respectively, and D is the total delay of the filter bank system. Without limiting the scope, the modulated filter banks studied in the following are systems where the analysis and synthesis prototypes are identical, i.e.

$$\hat{f}(n) = \hat{h}_0(n) = p_0(n), \quad 0 \le n \le N_h = N_f = N \quad (15)$$

where N is the length of the prototype filter $p_0(n)$.

It should be noted, however, when using the filter design schemes outlined in the present document, that filter banks using different analysis and synthesis prototype filters may be determined.

One inherent property of the cosine modulation is that every filter has two pass bands; one in the positive frequency range and one corresponding pass band in the negative frequency range. It can be verified that the so-called main, or significant, alias terms emerge from overlap in frequency between either the filters negative pass bands with frequency modulated versions of the positive pass bands, or reciprocally, the filters positive pass bands with frequency modulated versions of the negative pass bands. The last terms in Eq.(13) and (14), i.e. the terms $$\frac{\pi}{2}\left(k+\frac{1}{2}\right),$$

are selected so as to provide cancellation of the main alias terms in cosine modulated filter banks. Nevertheless, when modifying the subband samples, the cancelation of the main alias terms is impaired, thereby resulting in a strong impact of aliasing from the main alias terms. It is therefore desirable to remove these main alias terms from the subband samples altogether.

The removal of the main alias terms may be achieved by the use of so-called Complex-Exponential Modulated Filter Banks which are based on an extension of the cosine modulation to complex-exponential modulation. Such extension yields the analysis filters $h_k(n)$ as $$h_k(n) = p_0(n)\exp\left\{i\frac{\pi}{M}\left(k+\frac{1}{2}\right)\left(n-\frac{D}{2}\mp\frac{M}{2}\right)\right\}, \quad (16)$$
$$0 \le n < N, 0 \le k < M$$

using the same notation as before. This can be viewed as adding an imaginary part to the real-valued filter bank, where the imaginary part consists of sine modulated versions of the same prototype filter. Considering a real-valued input signal, the output from the filter bank can be interpreted as a set of subband signals, where the real and the imaginary parts are Hilbert transforms of each other. The resulting subbands are thus the analytic signals of the real-valued output obtained from the cosine modulated filter bank. Hence, due to the complex-valued representation, the subband signals are over-sampled by a factor two.

The synthesis filters are extended in the same way to $$f_k(n) = p_0(n)\exp\left\{i\frac{\pi}{M}\left(k+\frac{1}{2}\right)\left(n-\frac{D}{2}\pm\frac{M}{2}\right)\right\}, \quad (17)$$
$$0 \le n < N, 0 \le k < M.$$

Eq.(16) and (17) imply that the output from the synthesis bank is complex-valued. Using matrix notation, where $C_a$ is a matrix with the cosine modulated analysis filters from Eq.(13), and $S_a$ is a matrix with the sine modulation of the same argument, the filters of Eq.(16) are obtained as $C_a+j\,S_a$. In these matrices, k is the row index and n is the column index. Analogously, the matrix $C_s$ has synthesis filters from Eq.(14), and $S_s$ is the corresponding sine modulated version. Eq.(17) can thus be written $C_s+j\,S_s$, where k is the column index and n is the row index. Denoting the input signal x, the output signal y is found from $$y = (C_s+j\,S_s)(C_a+j\,S_a)x = (C_sC_a-S_sS_a)x+j(C_sS_a+S_sC_a)x \quad (18)$$

As seen from Eq.(18), the real part comprises two terms; the output from the cosine modulated filter bank and an output from a sine modulated filter bank. It is easily verified that if a cosine modulated filter bank has the PR property, then its sine modulated version, with a change of sign, constitutes a PR system as well. Thus, by taking the real part of the output, the complex-exponential modulated system offers the same reconstruction accuracy as the corresponding cosine modulated version. In other words, when using a real-valued input signal, the output signal of the complex-exponential modulated system may be determined by taking the real part of the output signal.

The complex-exponential modulated system may be extended to handle also complex-valued input signals. By extending the number of channels to 2M, i.e. by adding the filters for negative frequencies, and by keeping the imaginary part of the output signal, a pseudo QMF or a PR system for complex-valued signals is obtained.

It should be noted that the complex-exponential modulated filter bank has one pass band only for every filter in the positive frequency range. Hence, it is free from the main alias terms. The absence of main alias terms makes the aliasing cancellation constraint from the cosine (or sine) modulated filter bank obsolete in the complex-exponential modulated version. The analysis and synthesis filters can thus be given as $$h_k(n) = p_0(n)\exp\left\{i\frac{\pi}{M}\left(k+\frac{1}{2}\right)\left(n-\frac{D}{2}-A\right)\right\}, \quad (19)$$
$$0 \le n < N, 0 \le k < M$$

and $$f_k(n) = p_0(n)\exp\left\{i\frac{\pi}{M}\left(k+\frac{1}{2}\right)\left(n-\frac{D}{2}+A\right)\right\}, \quad (20)$$
$$0 \le n < N, 0 \le k < M$$

where A is an arbitrary (possibly zero) constant, and as before, M is the number of channels, N is the prototype filter length, and D is the system delay. By using different values of A, more efficient implementations of the analysis and synthesis filter banks, i.e. implementations with reduced complexity, can be obtained.

Before presenting a method for optimization of prototype filters, the disclosed approaches to the design of filter banks are summarized. Based on symmetric or asymmetric prototype filters, filter banks may be generated e.g. by modulating the prototype filters using a cosine function or a complex-exponential function. The prototype filters for the analysis and synthesis filter banks may either be different or identical. When using complex-exponential modulation, the main alias terms of the filter banks are obsolete and may be removed, thereby reducing the aliasing sensitivity to modifications of the subband signals of the resulting filter banks. Furthermore, when using asymmetric prototype filters the overall system delay of the filter banks may be reduced. It has also been shown that when using complex-exponential modulated filter banks, the output signal from a real valued input signal may be determined by taking the real part of the complex output signal of the filter bank.

In the following a method for optimization of the prototype filters is described in detail. Depending on the needs, the optimization may be directed at increasing the degree of perfect reconstruction, i.e. at reducing the combination of aliasing and amplitude distortion, at reducing the sensitivity to aliasing, at reducing the system delay, at reducing phase distortion, and/or at reducing amplitude distortion. In order to optimize the prototype filter $p_0(n)$ first expressions for the alias gain terms are determined. In the following, the alias gain terms for a complex exponential modulated filter bank are derived. However, it should be noted that the alias gain terms outlined are also valid for a cosine modulated (real valued) filter bank.

Referring to Eq.(4), the z-transform of the real part of the output signal $\hat{x}(n)$ is $$Z\{\text{Re}(\hat{x}(n))\} = \hat{X}_R(z) = \frac{\hat{X}(z) + \hat{X}*(z)}{2}. \tag{21}$$

The notation $\hat{X}^*(z)$ is the z-transform of the complex-conjugated sequence $\hat{x}(n)$. From Eq.(4), it follows that the transform of the real part of the output signal is $$\hat{X}_R(z) = \frac{1}{M} \sum_{l=0}^{M-1} \frac{1}{2} (X(zW^l)A_l(z) + X(zW^{-l})A_l*(z)), \tag{22}$$

where it was used that the input signal $x(n)$ is real-valued, i.e. $X^*(zW^l) = X(zW^{-l})$. Eq.(22) may after rearrangement be written $$\hat{X}_R(z) = \frac{1}{M}\left(X(z)\frac{1}{2}(A_0(z) + A_0*(z)) + \right.$$

$$\sum_{l=1}^{M-1} \frac{1}{2}(X(zW^l)A_l(z) + X(zW^{M-l})A_l*(z))\right) = \tag{23}$$

$$\frac{1}{M}\left(X(z)(A_0(z) + A_0*(z)) + \sum_{l=1}^{M-1} X(zW^l)\frac{1}{2}(A_l(z) + A_{M-l}*(z))\right) =$$

$$\frac{1}{M}\left(X(z)\tilde{A}_0(z) + \sum_{l=1}^{M-1} X(zW^l)\tilde{A}_l(z)\right) \text{ where}$$

$$\tilde{A}_l(z) = \frac{1}{2}(A_l(z) + A_{M-l}*(z)), \ 0 \le l < M \tag{24}$$

are the alias gain terms used in the optimization. It can be observed from Eq.(24) that $$\tilde{A}_{M-l}(z) = \frac{1}{2}(A_{M-l}(z) + A_l*(z)) = \tilde{A}_l*(z). \tag{25}$$

Specifically, for real-valued systems $$A_{M-l}*(z) = A_l(z) \tag{26}$$

which simplifies Eq.(24) into $$\tilde{A}_l(z) = A_l(z), \ 0 \le l < M. \tag{27}$$

By inspecting Eq.(23), and recalling the transform of Eq.(21), it can be seen that the real part of $a_0(n)$ must be a Dirac pulse for a PR system, i.e. $\tilde{A}_0(z)$ is on the form $\tilde{A}_0(z) = cz^{-D}$. Moreover, the real part of $a_{M/2}(n)$ must be zero, i.e. $\tilde{A}_{M/2}(z)$ must be zero, and the alias gains, for $l \ne 0$, M/2 must satisfy $$A_{M-l}(z) = -A_l*(z), \tag{28}$$

which for a real-valued system, with Eq.(26) in mind, means that all $a_l(n)$, $l=1 \ldots M-1$ must be zero. In pseudo QMF systems, Eq.(28) holds true only approximately. Moreover, the real part of $a_0(n)$ is not exactly a Dirac-pulse, nor is the real part of $a_{M/2}(n)$ exactly zero.

Before going into further details on the optimization of the prototype filters, the impact of modifications of the subband samples on aliasing is investigated. As already mentioned above, changing the gains of the channels in a cosine modulated filter bank, i.e. using the analysis/synthesis system as an equalizer, renders severe distortion due to the main alias terms. In theory, the main alias terms cancel each other out in a pair wise fashion. However, this theory of main alias term cancellation breaks, when different gains are applied to different subband channels. Hence, the aliasing in the output signal may be substantial. To show this, consider a filter bank where channel p and higher channels are set to zero gain, i.e.

$$v'_k(n) = g_k v_k(n), \ \begin{cases} g_k = 1, & 0 \le k < p \\ g_k = 0, & p \le k < M-1 \end{cases} \tag{29}$$

Figure 2:
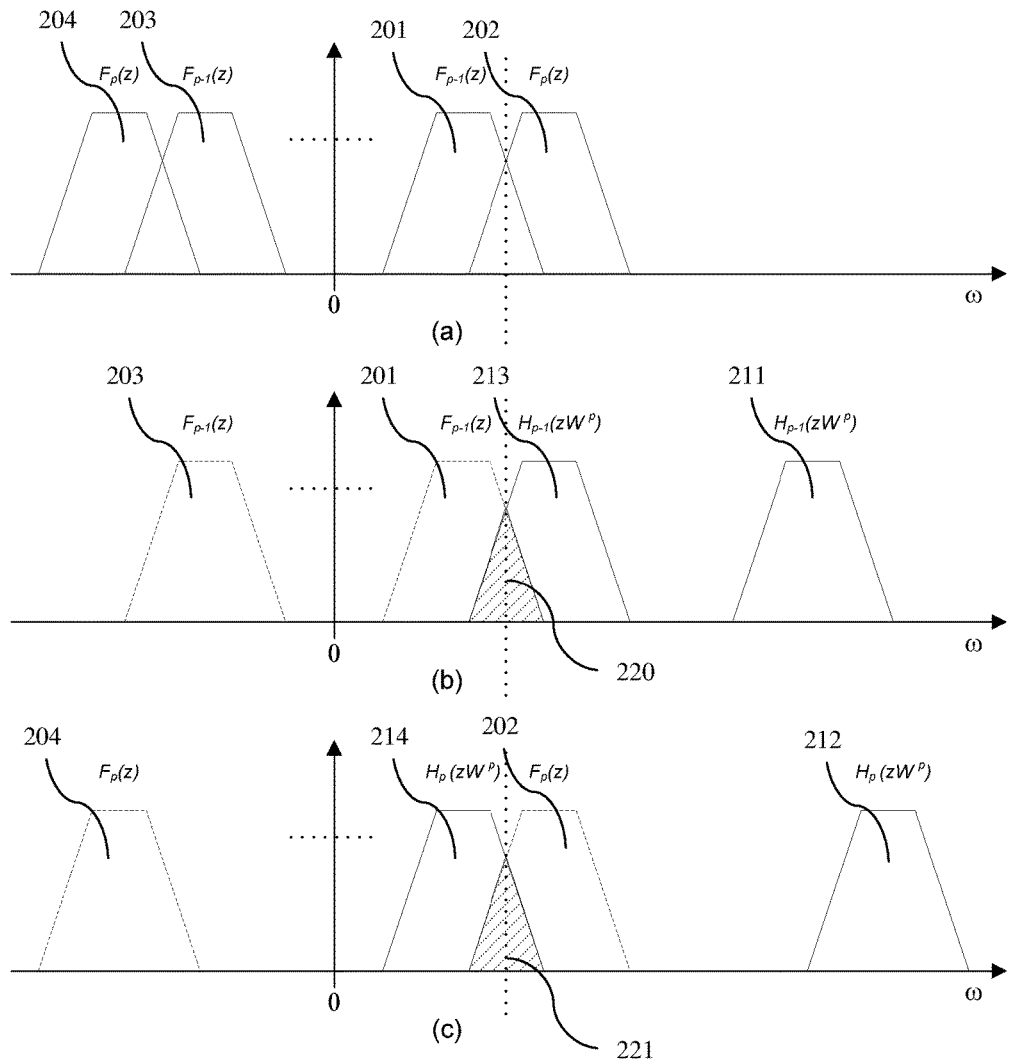
FIG. 2 shows the stylized frequency responses for a set of filters to illustrate the adverse effect when modifying the subband samples in a cosine modulated, i.e. real-valued, filter bank.

The stylized frequency responses of the analysis and synthesis filters of interest are shown in FIG. 2. FIG. 2(a) shows the synthesis channel filters $F_{p-1}(z)$ and $F_p(z)$, highlighted by reference signs 201 and 202, respectively. As already indicated above, the cosine modulation for each channel results in one positive frequency filter and one negative frequency filter. In other words, the positive frequency filters 201 and 202 have corresponding negative frequency filters 203 and 204, respectively.

The $p^{th}$ modulation of the analysis filter $H_{p-1}(z)$, i.e. $H_{p-1}(zW^p)$ indicated by reference signs 211 and 213, is depicted in FIG. 2(b) together with the synthesis filter $F_{p-1}(z)$, indicated by reference signs 201 and 203. In this Figure, reference sign 211 indicates the modulated version of the originally positive frequency filter $H_{p-1}(z)$ and reference sign 213 indicates the modulated version of the originally negative frequency filter $H_{p-1}(z)$. Due to the modulation of order p, the negative frequency filter 213 is moved to the positive frequency area and therefore overlaps with the positive synthesis filter 201. The shaded overlap 220 of the filters illustrates the energy of a main alias term.

In FIG. 2(c) the $p^{th}$ modulation of $H_p(z)$, i.e. $H_p(zW^p)$ indicated by reference signs 212 and 214, is shown together with the corresponding synthesis filter $F_p(z)$, reference signs 202 and 204. Again the negative frequency filter 214 is moved into the positive frequency area due to the modulation of order p. The shaded area 221 again pictorially shows the energy of a main alias term and would un-cancelled typically result in significant aliasing. To cancel the aliasing, the term should be the polarity reversed copy of the aliasing obtained from the intersection of filters $H_{p-1}(zW^p)$, 213, and $F_{p-1}(z)$, 201, of FIG. 2(*b*), i.e. the polarity reversed copy of the shaded area 220. In a cosine modulated filter bank, where the gains are unchanged, these main alias terms will usually cancel each other completely. However, in this example, the gain of the analysis (or synthesis) filter p is zero, so the aliasing induced by filters p−1 will remain un-cancelled in the output signal. An equally strong aliasing residue will also emerge in the negative frequency range.

When using complex-exponential modulated filter banks, the complex-valued modulation results in positive frequency filters only. Consequently, the main alias terms are gone, i.e. there is no significant overlap between the modulated analysis filters $H_p(zW^p)$ and their corresponding synthesis filters $F_p(z)$ and aliasing can be reduced significantly when using such filter bank systems as equalizers. The resulting aliasing is dependent only on the degree of suppression of the remaining alias terms.

Hence, even when using complex-exponential modulated filter banks, it is crucial to design a prototype filter for maximum suppression of the alias gains terms, although the main alias terms have been removed for such filter banks. Even though the remaining alias terms are less significant than the main alias terms, they may still generate aliasing which causes artifacts to the processed signal. Therefore, the design of such a prototype filter can preferably be accomplished by minimizing a composite objective function. For this purpose, various optimization algorithms may be used. Examples are e.g. linear programming methods, Downhill Simplex Method or a non-constrained gradient based method or other nonlinear optimization algorithms. In an exemplary embodiment an initial solution of the prototype filter is selected. Using the composite objective function, a direction for modifying the prototype filter coefficients is determined which provides the highest gradient of the composite objective function. Then the filter coefficients are modified using a certain step length and the iterative procedure is repeated until a minimum of the composite objective function is obtained. For further details on such optimization algorithms, reference is made to "Numerical Recipes in C, The Art of Scientific Computing, Second Edition" W. H. Press, S. A. Teukolsky, W. T. Vetterling, B. P. Flannery, Cambridge University Press, NY, 1992, which is incorporated by reference.

For improved alias term minimization (IATM) of the prototype filter, a preferred objective function may be denoted $$e_{tot}(\alpha) = \alpha e_t + (1-\alpha) e_a, \tag{30}$$

where the total error $e_{tot}(\alpha)$ is a weighted sum of the transfer function error $e_t$ and the aliasing error $e_a$. The first term on the right hand side (RHS) of Eq.(23) evaluated on the unit circle, i.e. for $z=e^{j\omega}$, can be used to provide a measure of the error energy $e_t$ of the transfer function as $$e_t = \frac{1}{2\pi} \int_{-\pi}^{\pi} \left| \frac{1}{2}(A_0(e^{j\omega}) + A_0*(e^{-j\omega})) - P(\omega)e^{-j\omega D} \right|^2 d\omega, \tag{31}$$

where $P(\omega)$ is a symmetric real-valued function defining the pass band and stop band ranges, and D is the total system delay. In other words, $P(\omega)$ describes the desired transfer function. In the most general case, such transfer function comprises a magnitude which is a function of the frequency $\omega$. For a real-valued system Eq.(31) simplifies to $$e_t = \frac{1}{2\pi} \int_{-\pi}^{\pi} |A_0(e^{j\omega}) - P(\omega)e^{-j\omega D}|^2 d\omega \tag{32}$$

The target function $P(\omega)$ and the target delay D may be selected as an input parameter to the optimization procedure. The expression $P(\omega)e^{-j\omega D}$ may be referred to as the target transfer function.

A measure of the energy of the total aliasing $e_a$ may be calculated by evaluating the sum of the alias terms on the right hand side (RHS) of Eq.(23), i.e. the second term of Eq.(23), on the unit circle as $$e_a = \frac{1}{2\pi} \sum_{l=1}^{M-1} \int_{-\pi}^{\pi} |\tilde{A}_l(e^{j\omega})|^2 d\omega, \tag{33}$$

For real-valued systems this translates to $$e_a = \frac{1}{2\pi} \sum_{l=1}^{M-1} \int_{-\pi}^{\pi} |A_l(e^{j\omega})|^2 d\omega. \tag{34}$$

Overall, an optimization procedure for determining a prototype filter $p_0(n)$ may be based on the minimization of the error of Eq. (30). The parameter may be used to distribute the emphasis between the transfer function and the sensitivity to aliasing of the prototype filter. While increasing the parameter a towards 1 will put more emphasis on the transfer function error $e_t$, reducing the parameter a towards 0 will put more emphasis on the aliasing error $e_a$. The parameters $P(\omega)$ and D may be used to set a target transfer function of the prototype filter $p_0(n)$, i.e. to define the pass band and stop band behavior and to define the overall system delay.

According to an example, a number of the filter bank channels k may be set to zero, e.g. the upper half of the filter bank channels are given zero gain. Consequently, the filter bank is triggered to generate a great amount of aliasing. This aliasing will be subsequently minimized by the optimization process. In other words, by setting a certain number of filter bank channels to zero, aliasing will be induced, in order to generate an aliasing error $e_a$ which may be minimized during the optimization procedure. Furthermore, computational complexity of the optimization process may be reduced by setting filter bank channels to zero.

According to an example, a prototype filter is optimized for a real valued, i.e. a cosine modulated, filter bank which may be more appropriate than directly optimizing the complex-valued version. This is because real-valued processing prioritizes far-off aliasing attenuation to a larger extent than complex-valued processing. However, when triggering aliasing as outlined above, the major part of the induced aliasing in this case will typically origin from the terms carrying the main alias terms. Hence, the optimization algorithm may spend resources on minimizing the main aliasing that is inherently non-present in the resulting complex-exponential modulated system. In order to alleviate this, the optimization may be done on a partially complex system; for the alias terms which are free from main aliasing, the optimization may be done using real-valued filter processing. On the other hand, the alias terms that would carry the main alias terms in a real-valued system would be modified for complex-valued filter processing. By means of such partially complex optimization, the benefits of performing the processing using real-valued processing may be obtained, while still optimizing the prototype filter for usage in a complex modulated filter bank system.

In an exemplary optimization where exactly the upper half of the filter bank channels are set to zero, the only alias term calculated from complex valued filters is the term l=M/2 of Eq.(33). In this example, the function $P(\omega)$ of Eq.(31), may be chosen as a unit magnitude constant ranging from $-\pi/2+\epsilon$ to $\pi/2-\epsilon$, where c is a fraction of $\pi/2$, in order to cover the frequency range constituting the pass band. Outside the pass band the function $P(\omega)$ may be defined to be zero or be left undefined. In the latter case, the error energy of the transfer function Eq.(31) is only evaluated between $-\pi/2+\epsilon$ and $\pi/2-\epsilon$. Alternatively and preferably, the pass band error $e_t$ could be calculated over all channels k= 0, ..., M-1, from $-\pi$ to $\pi$ with $P(\omega)$ being constant, while the aliasing is still calculated with a plurality of the channels set to zero as described above.

Typically the optimization procedure is an iterative procedure, where given the prototype filter coefficients $p_0(n)$ (n=0, ..., N-1) at a certain iteration step, the target delay D, the number of channels M, the numbers of low band channels set to zero loCut, the number of high band channels set to zero hiCut, and the weighting factor $\alpha$, a value for the objective function for this iteration step is calculated. Using semi-complex operations, this comprises the steps:

1. To obtain the pass band error $e_t$, evaluate Eq.(32) with $P(\omega)$ being a constant, using $$A_0(e^{j\omega}) = \sum_{k=0}^{M-1} H_k(e^{j\omega}) F_k(e^{j\omega}), \quad (35)$$

where $H_k(e^{j\omega})$ and $F_k(e^{j\omega})$ are the DFT transforms of the analysis and synthesis filters $h_k(n)$ and $f_k(n)$ as generated from the prototype filters coefficients at this iteration step from Eq. (13) to (15), respectively.

2. To obtain the aliasing error $e_a$, for aliasing terms not subject to significant aliasing, evaluate $$e_{aReal} = \frac{1}{2\pi} \sum_{\substack{l=1 \\ l \neq loCut, hiCut, \\ M-loCut, \\ M-hiCut}}^{M-1} \int_{-\pi}^{\pi} |A_l(e^{j\omega})|^2 d\omega, \quad (36)$$

where $A_l(e^{j\omega})$ is calculated as $$A_l(e^{j\omega}) = \sum_{k=loCut}^{M-1-hiCut} H_k\left(e^{j(\omega - \frac{2\pi}{M}l)}\right) F_k(e^{j\omega}) \quad (35)$$

and $H_k(e^{j\omega})$ and $F_k(e^{j\omega})$ are the DFT transforms, i.e. the z-transforms evaluated on the unit circle, of the analysis and synthesis filters $h_k(n)$ and $f_k(n)$ from Eq. (13) to (15).

3. For the terms subject to significant aliasing, evaluate $$e_{aCplx} = \frac{1}{2\pi} \sum_{\substack{l=loCut, \\ hiCut, \\ M-loCut, \\ M-hiCut}} \int_{-\pi}^{\pi} |\tilde{A}_l(e^{j\omega})|^2 d\omega \quad (38)$$

where $\tilde{A}_l(e^{j\omega})$ is given by Eq.(24), with $A_l(e^{j\omega})$ as Eq.(37), with $H_k(e^{j\omega})$ and $F_k(e^{j\omega})$ being the DFT transforms of $h_k(n)$ and $f_k(n)$ from Eq.(19) and (20).

4. The error is subsequently weighted with $\alpha$ as $$e_{tot}(\alpha) = \alpha e_t + (1-\alpha)(e_{a\,Re\,al} + e_{aCplx}). \quad (39)$$

Using any of the nonlinear optimization algorithms referred to above, this total error is reduced by modifying the coefficients of the prototype filter, until an optimal set of coefficients is obtained. By way of example, the direction of the greatest gradient of the error function $e_{tot}$ is determined for the prototype filter coefficients at a given iteration step. Using a certain step size the prototype filter coefficients are modified in the direction of the greatest gradient. The modified prototype filter coefficients are used as a starting point for the subsequent iteration step. This procedure is repeated until the optimization procedure has converged to a minimum value of the error function $e_{tot}$.

Figure 3:
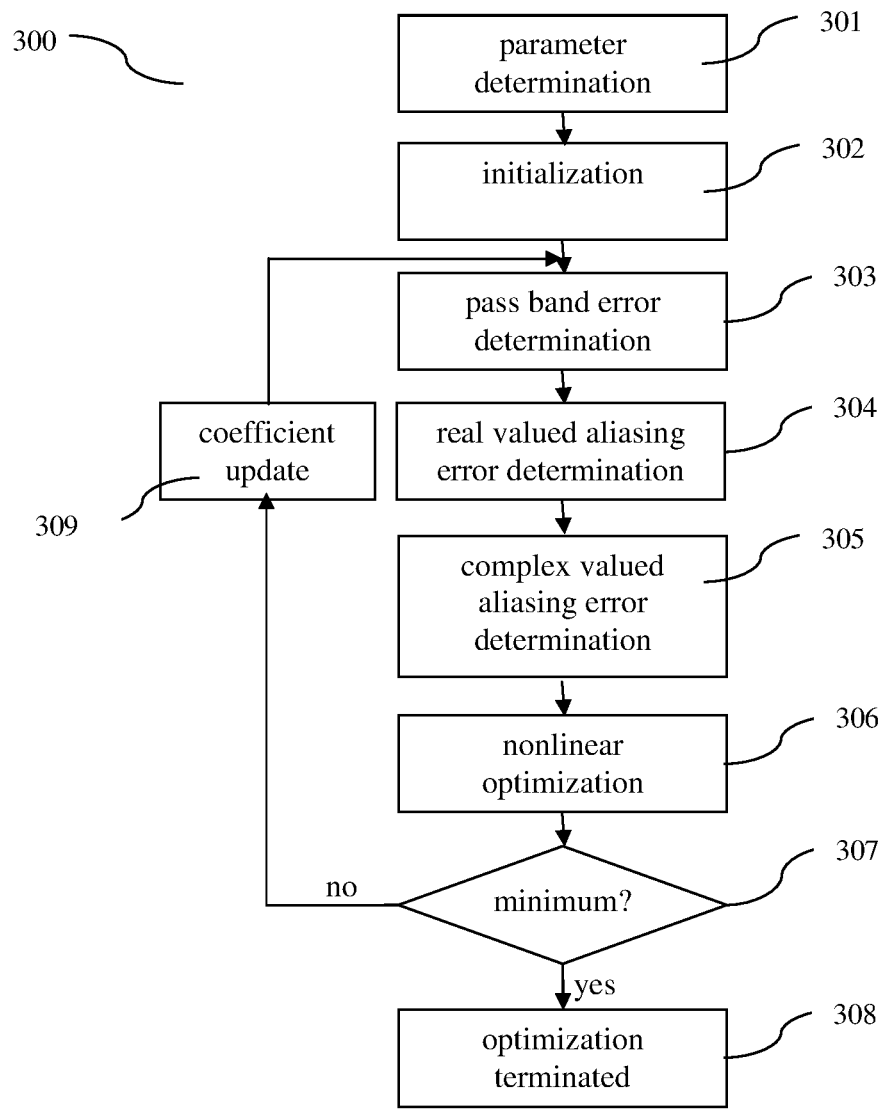
FIG. 3 shows a flow diagram of an example of the optimization procedure.

An exemplary embodiment of the optimization procedure is illustrated in FIG. 3 as a flow diagram 300. In a parameter determination step 301 the parameters of the optimization procedure, i.e. notably the target transfer function comprising the target delay D, the number of channels M of the target filter bank, the number N of coefficients of the prototype filter, the weighting parameter $\alpha$ of the objective error function, as well as the parameters for aliasing generation, i.e. loCut and/or hiCut, are defined. In an initialization step 302, a first set of coefficients of the prototype filter is selected.

In the pass band error determination unit 303, the pass band error term $e_t$ is determined using the given set of coefficients of the prototype filter. This may be done by using Eq.(32) in combination with Eqs.(35) and (13) to (15). In the real valued aliasing error determination unit 304, a first part $e_{aReal}$ of the aliasing error term $e_a$ may be determined using Eqs.(36) and (37) in combination with Eqs.(13) to (15). Furthermore, in the complex valued aliasing error determination unit 305, a second part $e_{aCplx}$ of the aliasing error term $e_a$ may be determined using Eq.(38) in combination with Eqs.(19) and (20). As a consequence, the objective function $e_{tot}$ may be determined from the results of the units 303, 304 and 305 using Eq.(39).

The nonlinear optimization unit 306 uses optimization methods, such as linear programming, in order to reduce the value of the objective function. By way of example, this may be done by determining a possibly maximum gradient of the objective function with regards to modifications of the coefficients of the prototype filter. In other words, those modifications of the coefficients of the prototype filter may be determined which result in a possibly maximum reduction of the objective function.

If the gradient determined in unit 306 remains within predetermined bounds, the decision unit 307 decides that a minimum of the objective function has been reached and terminates the optimization procedure in step 308. If on the other hand, the gradient exceeds the predetermined value, then the coefficients of the prototype filter are updated in the update unit 309. The update of the coefficients may be performed by modifying the coefficients with a predetermined step into the direction given by the gradient. Eventually, the updated coefficients of the prototype filter are reinserted as an input to the pass band error determination unit 303 for another iteration of the optimization procedure.

Overall, it can be stated that using the above error function and an appropriate optimization algorithm, prototype filters may be determined that are optimized with respect to their degree of perfect reconstruction, i.e. with respect to low aliasing in combination with low phase and/or amplitude distortion, their resilience to aliasing due to subband modifications, their system delay and/or their transfer function. The design method provides parameters, notably a weighting parameter α, a target delay D, a target transfer function P(ω), a filter length N, a number of filter bank channels M, as well as aliasing trigger parameters hiCut, loCut, which may be selected to obtain an optimal combination of the above mentioned filter properties. Furthermore, the setting to zero of a certain number of subband channels, as well as the partial complex processing may be used to reduce the overall complexity of the optimization procedure. As a result, asymmetric prototype filters with a near perfect reconstruction property, low sensitivity to aliasing and a low system delay may be determined for usage in a complex exponential modulated filter bank. It should be noted that the above determination scheme of a prototype filter has been outlined in the context of a complex exponential modulated filter bank. If other filter bank design methods are used, e.g. cosine modulated or sine modulated filter bank design methods, then the optimization procedure may be adapted by generating the analysis and synthesis filters $h_k(n)$ and $f_k(n)$ using the design equations of the respective filter bank design method. By way of example, Eqs.(13) to (15) may be used in the context of a cosine modulated filter bank.

Figure 4:
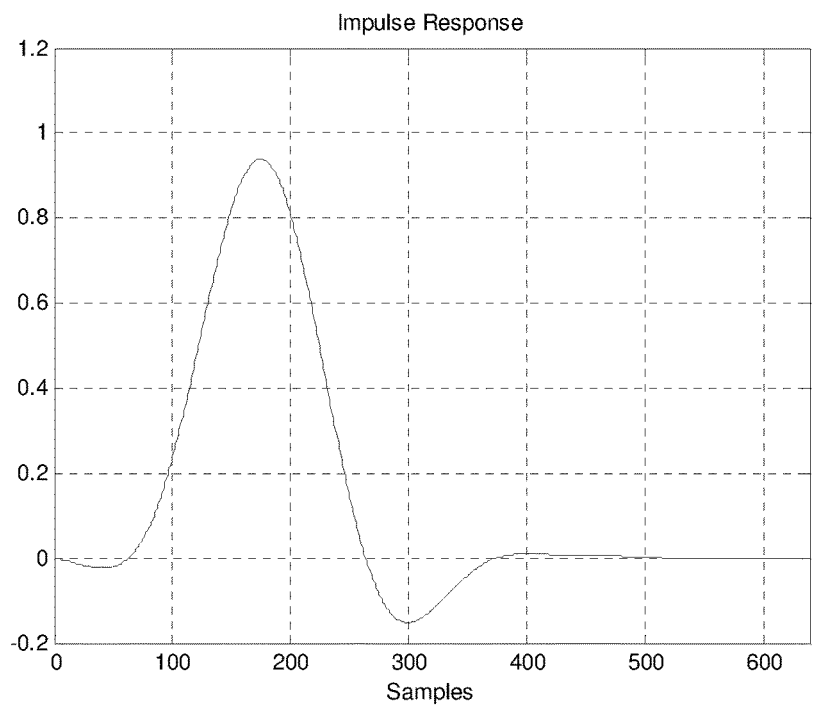
FIG. 4 shows a time domain plot and the frequency response of an optimized prototype filter for a low delay modulated filter bank having 64 channels and a total system delay of 319 samples.
Figure 4:
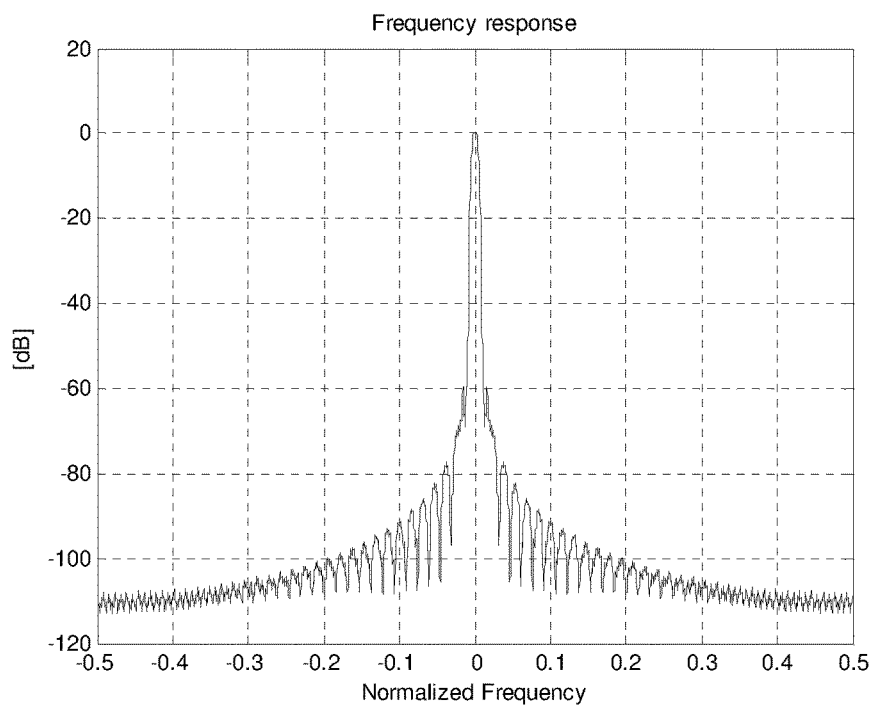

In the following, a detailed example of a 64 channel low delay filter bank is described. Using the proposed aforementioned optimization method, a detailed example of an alias gain term optimized, low delay, 64-channel filter bank (M=64) will be outlined. In this example the partially complex optimization method has been used and the uppermost 40 channels have been set to zero during the prototype filter optimization, i.e. hiCut=40, whereas the loCut parameter remained unused. Hence, all alias gain terms, except $\tilde{A}_l$, where l=24, 40, are calculated using real-valued filters. The total system delay is chosen as D=319, and the prototype filter length is N=640. A time domain plot of the resulting prototype filter is given in FIG. 4(a), and the frequency response of the prototype filter is depicted in FIG. 4(b). The filter bank offers a pass band (amplitude and phase) reconstruction error of −72 dB. The phase deviation from a linear phase is smaller than ±0.02°, and the aliasing suppression is 76 dB when no modifications are done to the subband samples. The actual filter coefficients are tabulated in Table 1. Note that the coefficients are scaled by a factor M=64 in respect to other equations in this document that are dependent on an absolute scaling of the prototype filter.

While the above description of the design of the filter bank is based on a standard filter bank notation, an example for operating the designed filter bank may operate in other filter bank descriptions or notations, e.g. filter bank implementations which allow a more efficient operation on a digital signal processor.

In an example, the steps for filtering a time domain signal using the optimized prototype filter may be described as follows:

In order to operate the filter bank in an efficient manner, the prototype filter, i.e. $p_0(n)$ from Table 1, is first arranged in the poly-phase representation, where every other of the poly-phase filter coefficients are negated and all coefficient are time-flipped as $$p'_0(639-128m-n)=(-1)^m p_0(128m+n), \ 0 \le n \le 128, \ 0 \le m \le 5 \quad (40)$$

The analysis stage begins with the poly-phase representation of the filter being applied to the time domain signal x(n) to produce a vector $x_l(n)$ of length 128 as $$x_{127-l}(n) = \sum_{m=0}^{4} p'_0(128m+l)x(128m+l+64n), \quad (41)$$

$$0 \le l < 128, n = 0, 1, \ldots$$

$x_l(n)$ is subsequently multiplied with a modulation matrix as $$v_k(n) = \sum_{l=0}^{127} x_l(n)\exp\left(j\frac{\pi}{128}\left(k+\frac{1}{2}\right)(2l+129)\right), \quad (42)$$

$$0 \le k < 64,$$

where $v_k(n)$, k=0 ... 63, constitute the subband signals. The time index n is consequently given in subband samples.

The complex-valued subband signals can then be modified, e.g. according to some desired, possibly time-varying and complex-valued, equalization curve $g_k(n)$, as $$v_k^{(m)}(n)=g_k(n)v_k(n), \ 0 \le k \le 64. \quad (43)$$

The synthesis stage starts with a demodulation step of the modified subband signals as $$u_l(n) = \frac{1}{64}\sum_{k=0}^{63} \text{Re}\left\{v_k^{(m)}(n)\exp\left(j\frac{\pi}{128}\left(k+\frac{1}{2}\right)(2l-255)\right)\right\}, \quad (44)$$

$$0 \le l < 128.$$

It should be noted that the modulation steps of Eqs.(42) and (44) may be accomplished in a computationally very efficient manner with fast algorithms using fast Fourier transform (FFT) kernels.

The demodulated samples are filtered with the poly-phase representation of the prototype filter and accumulated to the output time domain signal $\hat{x}(n)$ according to $$\hat{x}(128m+l+64n)=\hat{x}(128m+l+64n)+ \ p'_0(639-128m-l)u_l(l), \ 0 \le l \le 128, 0 \le m < 5, n=0,1, \quad (45)$$

where $\hat{x}(n)$ is set to 0 for all n at start-up time.

It should be noted that both floating point and fixed point implementations might change the numerical accuracy of the coefficients given in Table 1 to something more suitable for processing. Without limiting the scope, the values may be quantized to a lower numerical accuracy by rounding, truncating and/or by scaling the coefficients to integer or other representations, in particular representations that are adapted to the available resources of a hardware and/or software platform on which the filter bank is to operate.

Moreover, the example above outlines the operation where the time domain output signal is of the same sampling frequency as the input signal. Other implementations may resample the time domain signal by using different sizes, i.e. different number of channels, of the analysis and synthesis filter banks, respectively. However, the filter banks should be based on the same prototype filter, and are obtained by resampling of the original prototype filter through either decimation or interpolation. As an example, a prototype filter for a 32 channel filter bank is achieved by resampling the coefficients $p_0(n)$ as $$p_0^{(32)}(i) = \frac{1}{2}[p_0(2i+1) + p_0(2i)], 0 \leq i < 320.$$

The length of the new prototype filter is hence 320 and the delay is $D = \lfloor 319/2 \rfloor = 159$, where the operator $\lfloor \cdot \rfloor$ returns the integer part of its argument.

TABLE 1

Coefficients of a 64 channel low delay prototype filter

| n | $P_0(n)$ |
|---|---|
| 0 | −7.949261005955764e−4 |
| 1 | −1.232074328145439e−3 |
| 2 | −1.601053942982895e−3 |
| 3 | −1.980720409470913e−3 |
| 4 | −2.397504953865715e−3 |
| 5 | −2.838709203607079e−3 |
| 6 | −3.314755401090670e−3 |
| 7 | −3.825180949035082e−3 |
| 8 | −4.365307413613105e−3 |
| 9 | −4.937260935539922e−3 |
| 10 | −5.537381514710146e−3 |
| 11 | −6.164241937824271e−3 |
| 12 | −6.816579194002503e−3 |
| 13 | −7.490102145765528e−3 |
| 14 | −8.183711450708110e−3 |
| 15 | −8.894930051379498e−3 |
| 16 | −9.620004581607449e−3 |
| 17 | −1.035696814015217e−2 |
| 18 | −1.110238617202191e−2 |
| 19 | −1.185358556146692e−2 |
| 20 | −1.260769256679562e−2 |
| 21 | −1.336080675156018e−2 |
| 22 | −1.411033176541011e−2 |
| 23 | −1.485316243134798e−2 |
| 24 | −1.558550942227883e−2 |
| 25 | −1.630436835497356e−2 |
| 26 | −1.700613959422392e−2 |
| 27 | −1.768770555992799e−2 |
| 28 | −1.834568069395711e−2 |
| 29 | −1.897612496483356e−2 |
| 30 | −1.957605813345359e−2 |
| 31 | −2.014213322475170e−2 |
| 32 | −2.067061748933033e−2 |
| 33 | −2.115814831921453e−2 |
| 34 | −2.160130854695980e−2 |
| 35 | −2.199696217022438e−2 |
| 36 | −2.234169110698344e−2 |
| 37 | −2.263170795250229e−2 |
| 38 | −2.286416556008894e−2 |
| 39 | −2.303589449043864e−2 |
| 40 | −2.314344724218223e−2 |
| 41 | −2.318352524475873e−2 |
| 42 | −2.315297727620401e−2 |
| 43 | −2.304918234544422e−2 |
| 44 | −2.286864521420490e−2 |
| 45 | −2.260790764376614e−2 |
| 46 | −2.226444264459477e−2 |
| 47 | −2.183518667784246e−2 |
| 48 | −2.131692017682024e−2 |
| 49 | −2.070614962636994e−2 |
| 50 | −1.999981321635736e−2 |
| 51 | −1.919566223498554e−2 |
| 52 | −1.828936158524688e−2 |

TABLE 1-continued

Coefficients of a 64 channel low delay prototype filter

| n | $P_0(n)$ |
|---|---|
| 53 | −1.727711874492186e−2 |
| 54 | −1.615648494779686e−2 |
| 55 | −1.492335807272955e−2 |
| 56 | −1.357419760297910e−2 |
| 57 | −1.210370330110896e−2 |
| 58 | −1.050755164953818e−2 |
| 59 | −8.785746151726750e−3 |
| 60 | −6.927329556345040e−3 |
| 61 | −4.929378450735877e−3 |
| 62 | −2.800333941149626e−3 |
| 63 | −4.685580749545335e−4 |
| 64 | 2.210315255690887e−3 |
| 65 | 5.183294908090526e−3 |
| 66 | 8.350964449424035e−3 |
| 67 | 1.166118535611788e−2 |
| 68 | 1.513166797475777e−2 |
| 69 | 1.877264877027943e−2 |
| 70 | 2.258899222368603e−2 |
| 71 | 2.659061474958830e−2 |
| 72 | 3.078087745385930e−2 |
| 73 | 3.516391224752870e−2 |
| 74 | 3.974674893613862e−2 |
| 75 | 4.453308211110493e−2 |
| 76 | 4.952626097917320e−2 |
| 77 | 5.473026727738295e−2 |
| 78 | 6.014835645056577e−2 |
| 79 | 6.578414516120631e−2 |
| 80 | 7.163950999489413e−2 |
| 81 | 7.771656494569829e−2 |
| 82 | 8.401794441130064e−2 |
| 83 | 9.054515924487507e−2 |
| 84 | 9.729889691289549e−2 |
| 85 | 1.042804039148369e−1 |
| 86 | 1.114900795290448e−1 |
| 87 | 1.189284254931251e−1 |
| 88 | 1.265947532678997e−1 |
| 89 | 1.344885599112251e−1 |
| 90 | 1.426090972422485e−1 |
| 91 | 1.509550307914161e−1 |
| 92 | 1.595243494708706e−1 |
| 93 | 1.683151598707939e−1 |
| 94 | 1.773250461581686e−1 |
| 95 | 1.865511418631904e−1 |
| 96 | 1.959902227114119e−1 |
| 97 | 2.056386275763479e−1 |
| 98 | 2.154925974105375e−1 |
| 99 | 2.255475564993390e−1 |
| 100 | 2.357989864681126e−1 |
| 101 | 2.462418809459464e−1 |
| 102 | 2.568709554604541e−1 |
| 103 | 2.676805358910440e−1 |
| 104 | 2.786645734207760e−1 |
| 105 | 2.898168394038287e−1 |
| 106 | 3.011307516871287e−1 |
| 107 | 3.125994749246541e−1 |
| 108 | 3.242157192666507e−1 |
| 109 | 3.359722796803192e−1 |
| 110 | 3.478614117031655e−1 |
| 111 | 3.598752336287570e−1 |
| 112 | 3.720056632072922e−1 |
| 113 | 3.842444358173011e−1 |
| 114 | 3.965831241942321e−1 |
| 115 | 4.090129566893579e−1 |
| 116 | 4.215250930838456e−1 |
| 117 | 4.341108982328533e−1 |
| 118 | 4.467608231633283e−1 |
| 119 | 4.594659376709624e−1 |
| 120 | 4.722166595058233e−1 |
| 121 | 4.850038204075748e−1 |
| 122 | 4.978178235802594e−1 |
| 123 | 5.106483456192374e−1 |
| 124 | 5.234865375971977e−1 |
| 125 | 5.363218470709771e−1 |
| 126 | 5.491440356706657e−1 |
| 127 | 5.619439923555571e−1 |
| 128 | 5.746001351404267e−1 |

TABLE 1-continued

Coefficients of a 64 channel low delay prototype filter

| n | $P_0(n)$ |
|---|---|
| 129 | 5.872559277139351e−1 |
| 130 | 5.9998618924353250e−1 |
| 131 | 6.123980151490041e−1 |
| 132 | 6.248504862282382e−1 |
| 133 | 6.372102969387355e−1 |
| 134 | 6.494654463921502e−1 |
| 135 | 6.616044277534099e−1 |
| 136 | 6.736174463977084e−1 |
| 137 | 6.854929931488056e−1 |
| 138 | 6.972201618598393e−1 |
| 139 | 7.087881675504216e−1 |
| 140 | 7.201859881692665e−1 |
| 141 | 7.314035334082558e−1 |
| 142 | 7.424295078874311e−1 |
| 143 | 7.532534422335129e−1 |
| 144 | 7.638649113306198e−1 |
| 145 | 7.742538112450130e−1 |
| 146 | 7.844095212375462e−1 |
| 147 | 7.943222347831999e−1 |
| 148 | 8.039818519286321e−1 |
| 149 | 8.133789939828571e−1 |
| 150 | 8.225037151897938e−1 |
| 151 | 8.313468549324594e−1 |
| 152 | 8.398991600556686e−1 |
| 153 | 8.481519810689574e−1 |
| 154 | 8.560963550316389e−1 |
| 155 | 8.637239863984174e−1 |
| 156 | 8.710266607496513e−1 |
| 157 | 8.779965198108476e−1 |
| 158 | 8.846258145496611e−1 |
| 159 | 8.909071890560218e−1 |
| 160 | 8.968337036455653e−1 |
| 161 | 9.023985431182168e−1 |
| 162 | 9.075955881221292e−1 |
| 163 | 9.124187296760565e−1 |
| 164 | 9.168621399784253e−1 |
| 165 | 9.209204531389191e−1 |
| 166 | 9.245886139655739e−1 |
| 167 | 9.278619263447355e−1 |
| 168 | 9.307362242659798e−1 |
| 169 | 9.332075222986479e−1 |
| 170 | 9.352724511271509e−1 |
| 171 | 9.369278287932853e−1 |
| 172 | 9.381709878904797e−1 |
| 173 | 9.389996917291260e−1 |
| 174 | 9.394121230559878e−1 |
| 175 | 9.394068064126931e−1 |
| 176 | 9.389829174860432e−1 |
| 177 | 9.381397976778112e−1 |
| 178 | 9.368773370086998e−1 |
| 179 | 9.351961242404785e−1 |
| 180 | 9.330966718935136e−1 |
| 181 | 9.305803205049067e−1 |
| 182 | 9.276488080866625e−1 |
| 183 | 9.243040558859498e−1 |
| 184 | 9.205488097488350e−1 |
| 185 | 9.163856478189402e−1 |
| 186 | 9.118180055332041e−1 |
| 187 | 9.068503557855540e−1 |
| 188 | 9.014858673099563e−1 |
| 189 | 8.957295448806664e−1 |
| 190 | 8.895882558527375e−1 |
| 191 | 8.830582442418677e−1 |
| 192 | 8.761259906419252e−1 |
| 193 | 8.688044201931157e−1 |
| 194 | 8.611140376567749e−1 |
| 195 | 8.530684188588082e−1 |
| 196 | 8.446723286380624e−1 |
| 197 | 8.359322523144003e−1 |
| 198 | 8.268555005748937e−1 |
| 199 | 8.174491260941859e−1 |
| 200 | 8.077214932837783e−1 |
| 201 | 7.976809997929416e−1 |
| 202 | 7.873360271773119e−1 |
| 203 | 7.766956604639097e−1 |
| 204 | 7.657692341138960e−1 |
| 205 | 7.545663748526984e−1 |
| 206 | 7.430967641354331e−1 |
| 207 | 7.313705248813991e−1 |
| 208 | 7.193979757178656e−1 |
| 209 | 7.071895814695481e−1 |
| 210 | 6.947561322714310e−1 |
| 211 | 6.821083135331770e−1 |
| 212 | 6.692573319585476e−1 |
| 213 | 6.562143182387809e−1 |
| 214 | 6.429904538706975e−1 |
| 215 | 6.295973685335782e−1 |
| 216 | 6.160464554756299e−1 |
| 217 | 6.023493418727370e−1 |
| 218 | 5.885176369189331e−1 |
| 219 | 5.745630487304467e−1 |
| 220 | 5.604973280717471e−1 |
| 221 | 5.463322649085826e−1 |
| 222 | 5.320795532569365e−1 |
| 223 | 5.177509557831821e−1 |
| 224 | 5.033582842235876e−1 |
| 225 | 4.889131973708936e−1 |
| 226 | 4.744274511088447e−1 |
| 227 | 4.599125196114154e−1 |
| 228 | 4.453800290341801e−1 |
| 229 | 4.308413090599260e−1 |
| 230 | 4.163077444128621e−1 |
| 231 | 4.017905891818764e−1 |
| 232 | 3.873008819361793e−1 |
| 233 | 3.728496914938361e−1 |
| 234 | 3.584479792756540e−1 |
| 235 | 3.441060828393923e−1 |
| 236 | 3.298346836739700e−1 |
| 237 | 3.156442070098094e−1 |
| 238 | 3.015447421741344e−1 |
| 239 | 2.875462383794429e−1 |
| 240 | 2.736584401802921e−1 |
| 241 | 2.598909819775319e−1 |
| 242 | 2.462531686198759e−1 |
| 243 | 2.327540108460799e−1 |
| 244 | 2.194025590645563e−1 |
| 245 | 2.062071988727463e−1 |
| 246 | 1.931765200055820e−1 |
| 247 | 1.803186073942884e−1 |
| 248 | 1.676410590306998e−1 |
| 249 | 1.551517472268748e−1 |
| 250 | 1.428578337203540e−1 |
| 251 | 1.307662172525294e−1 |
| 252 | 1.188837988250476e−1 |
| 253 | 1.072167300568495e−1 |
| 254 | 9.577112136322552e−2 |
| 255 | 8.455282024161610e−2 |
| 256 | 7.355793885744523e−2 |
| 257 | 6.280513608528435e−2 |
| 258 | 5.229589453075828e−2 |
| 259 | 4.203381031272017e−2 |
| 260 | 3.202301123728688e−2 |
| 261 | 2.226720136600903e−2 |
| 262 | 1.277000586069404e−2 |
| 263 | 3.534672952747162e−3 |
| 264 | −5.435672410526313e−3 |
| 265 | −1.413857081863553e−2 |
| 266 | −2.257147752062613e−2 |
| 267 | −3.073254829666290e−2 |
| 268 | −3.861994968092324e−2 |
| 269 | −4.623245158508806e−2 |
| 270 | −5.356875686113461e−2 |
| 271 | −6.062844791918062e−2 |
| 272 | −6.741087925238425e−2 |
| 273 | −7.391592258255635e−2 |
| 274 | −8.014393008412193e−2 |
| 275 | −8.609517876186421e−2 |
| 276 | −9.177059647159572e−2 |
| 277 | −9.717118785672957e−2 |
| 278 | −1.022983899423088e−1 |
| 279 | −1.071535873159799e−1 |
| 280 | −1.117390940373963e−1 |

TABLE 1-continued

Coefficients of a 64 channel low delay prototype filter

| n | $P_0(n)$ |
|---|---|
| 281 | −1.160565563647874e−1 |
| 282 | −1.201089957775325e−1 |
| 283 | −1.238986104503973e−1 |
| 284 | −1.274286534385776e−1 |
| 285 | −1.307022037585206e−1 |
| 286 | −1.337226598624689e−1 |
| 287 | −1.364936502000925e−1 |
| 288 | −1.390190836588895e−1 |
| 289 | −1.413030335001078e−1 |
| 290 | −1.433497698594264e−1 |
| 291 | −1.451636222445455e−1 |
| 292 | −1.467494079461177e−1 |
| 293 | −1.481116975400198e−1 |
| 294 | −1.492556249421260e−1 |
| 295 | −1.501862836334994e−1 |
| 296 | −1.509089024309573e−1 |
| 297 | −1.514289033634045e−1 |
| 298 | −1.517517580141857e−1 |
| 299 | −1.518832057448775e−1 |
| 300 | −1.518289202172233e−1 |
| 301 | −1.515947694390820e−1 |
| 302 | −1.511866738705995e−1 |
| 303 | −1.506105955209982e−1 |
| 304 | −1.498725980913964e−1 |
| 305 | −1.489787144055076e−1 |
| 306 | −1.479352185844335e−1 |
| 307 | −1.467481851768966e−1 |
| 308 | −1.454239120021382e−1 |
| 309 | −1.439685961257477e−1 |
| 310 | −1.423884130127772e−1 |
| 311 | −1.406896926563808e−1 |
| 312 | −1.388785953623746e−1 |
| 313 | −1.369612022106282e−1 |
| 314 | −1.349437727408798e−1 |
| 315 | −1.328323917411932e−1 |
| 316 | −1.306331212230066e−1 |
| 317 | −1.283520431992394e−1 |
| 318 | −1.259952253813674e−1 |
| 319 | −1.235680807908494e−1 |
| 320 | −1.210755701624524e−1 |
| 321 | −1.185237142283346e−1 |
| 322 | −1.159184450952715e−1 |
| 323 | −1.132654367461266e−1 |
| 324 | −1.105698782276963e−1 |
| 325 | −1.078369135648348e−1 |
| 326 | −1.050716118804287e−1 |
| 327 | −1.022789198651472e−1 |
| 328 | −9.946367410320074e−2 |
| 329 | −9.663069107327295e−2 |
| 330 | −9.378454802679648e−2 |
| 331 | −9.092970207094843e−2 |
| 332 | −8.807051083640835e−2 |
| 333 | −8.521107266503664e−2 |
| 334 | −8.235562752947133e−2 |
| 335 | −7.950789957683559e−2 |
| 336 | −7.667177989755110e−2 |
| 337 | −7.385092587441364e−2 |
| 338 | −7.104866702770536e−2 |
| 339 | −6.826847016140082e−2 |
| 340 | −6.551341011471171e−2 |
| 341 | −6.278658929544248e−2 |
| 342 | −6.009091369370080e−2 |
| 343 | −5.742919825837360e−2 |
| 344 | −5.480383115198150e−2 |
| 345 | −5.221738078739957e−2 |
| 346 | −4.967213638808988e−2 |
| 347 | −4.717023345307148e−2 |
| 348 | −4.471364025371278e−2 |
| 349 | −4.230438144160113e−2 |
| 350 | −3.994384828552555e−2 |
| 351 | −3.763371362431132e−2 |
| 352 | −3.537544041600725e−2 |
| 353 | −3.317035188016126e−2 |
| 354 | −3.101971215825843e−2 |
| 355 | −2.892453070357571e−2 |
| 356 | −2.688575425197388e−2 |
| 357 | −2.490421725219031e−2 |
| 358 | −2.298058501129975e−2 |
| 359 | −2.111545692324888e−2 |
| 360 | −1.930927680100128e−2 |
| 361 | −1.756239270089077e−2 |
| 362 | −1.587511449869362e−2 |
| 363 | −1.424750749465213e−2 |
| 364 | −1.267955527855867e−2 |
| 365 | −1.117125833414906e−2 |
| 366 | −9.722405440999532e−3 |
| 367 | −8.332704660914712e−3 |
| 368 | −7.001789872901951e−3 |
| 369 | −5.729226040772489e−3 |
| 370 | −4.514503359783591e−3 |
| 371 | −3.356946762357950e−3 |
| 372 | −2.255849987026407e−3 |
| 373 | −1.210459261524451e−3 |
| 374 | −2.199474640570699e−4 |
| 375 | 7.167268627887994e−4 |
| 376 | 1.600440185590357e−3 |
| 377 | 2.432366605744087e−3 |
| 378 | 3.213605482343768e−3 |
| 379 | 3.945301462616821e−3 |
| 380 | 4.628665378925932e−3 |
| 381 | 5.264976586624488e−3 |
| 382 | 5.855653555178131e−3 |
| 383 | 6.401634331453516e−3 |
| 384 | 6.903046246257517e−3 |
| 385 | 7.364537203059431e−3 |
| 386 | 7.785917436812734e−3 |
| 387 | 8.168780818165564e−3 |
| 388 | 8.514510536234886e−3 |
| 389 | 8.824526581578384e−3 |
| 390 | 9.100444687042341e−3 |
| 391 | 9.343819821939981e−3 |
| 392 | 9.556089247587111e−3 |
| 393 | 9.738929904236388e−3 |
| 394 | 9.893728065983530e−3 |
| 395 | 1.002221842309897e−2 |
| 396 | 1.012567516563336e−2 |
| 397 | 1.020575952382967e−2 |
| 398 | 1.026389875785943e−2 |
| 399 | 1.030162959448537e−2 |
| 400 | 1.032037849566083e−2 |
| 401 | 1.032154667898522e−2 |
| 402 | 1.030658039367325e−2 |
| 403 | 1.027682791880806e−2 |
| 404 | 1.023360327572998e−2 |
| 405 | 1.017821017226088e−2 |
| 406 | 1.011195224927225e−2 |
| 407 | 1.003602653649432e−2 |
| 408 | 9.951564927254814e−3 |
| 409 | 9.859735321541087e−3 |
| 410 | 9.761689935477358e−3 |
| 411 | 9.658335268268776e−3 |
| 412 | 9.550506541750015e−3 |
| 413 | 9.439239790180602e−3 |
| 414 | 9.325311662898867e−3 |
| 415 | 9.209571052890813e−3 |
| 416 | 9.092729858436259e−3 |
| 417 | 8.975504153186832e−3 |
| 418 | 8.858564024669505e−3 |
| 419 | 8.742547510216072e−3 |
| 420 | 8.627917215653412e−3 |
| 421 | 8.515236113018675e−3 |
| 422 | 8.404834686887089e−3 |
| 423 | 8.297046056582970e−3 |
| 424 | 8.192181771808344e−3 |
| 425 | 8.090558375952284e−3 |
| 426 | 7.992340268718087e−3 |
| 427 | 7.897787592331651e−3 |
| 428 | 7.806979111626161e−3 |
| 429 | 7.720005213599928e−3 |
| 430 | 7.636899169053526e−3 |
| 431 | 7.557692588413262e−3 |
| 432 | 7.482361735247336e−3 |

TABLE 1-continued

Coefficients of a 64 channel low delay prototype filter

| n | $P_0(n)$ |
|---|---|
| 433 | 7.410882580163479e−3 |
| 434 | 7.343084196594709e−3 |
| 435 | 7.278918614409016e−3 |
| 436 | 7.218206312830178e−3 |
| 437 | 7.160843298305507e−3 |
| 438 | 7.106600272887440e−3 |
| 439 | 7.055249359796239e−3 |
| 440 | 7.006591539682229e−3 |
| 441 | 6.960450953203489e−3 |
| 442 | 6.916554770130135e−3 |
| 443 | 6.874623603448978e−3 |
| 444 | 6.834443173086539e−3 |
| 445 | 6.795786363014294e−3 |
| 446 | 6.758476537306303e−3 |
| 447 | 6.722125942626111e−3 |
| 448 | 6.686140904391229e−3 |
| 449 | 6.650228698006217e−3 |
| 450 | 6.614354298921371e−3 |
| 451 | 6.578320578669048e−3 |
| 452 | 6.541865503698597e−3 |
| 453 | 6.504729306516950e−3 |
| 454 | 6.466690242148724e−3 |
| 455 | 6.427556828582072e−3 |
| 456 | 6.387124476277924e−3 |
| 457 | 6.345262303711465e−3 |
| 458 | 6.301766582696827e−3 |
| 459 | 6.256542736138121e−3 |
| 460 | 6.209372064970386e−3 |
| 461 | 6.160215935384255e−3 |
| 462 | 6.108902434484468e−3 |
| 463 | 6.055355267266873e−3 |
| 464 | 5.999473903317320e−3 |
| 465 | 5.941211676077848e−3 |
| 466 | 5.880495927392625e−3 |
| 467 | 5.817286139372493e−3 |
| 468 | 5.751536864441650e−3 |
| 469 | 5.683230954033062e−3 |
| 470 | 5.612375999953358e−3 |
| 471 | 5.538957988293047e−3 |
| 472 | 5.462963107291498e−3 |
| 473 | 5.384396217909888e−3 |
| 474 | 5.303337109336215e−3 |
| 475 | 5.219739772898678e−3 |
| 476 | 5.133623037830525e−3 |
| 477 | 5.045046346880483e−3 |
| 478 | 4.954008597884707e−3 |
| 479 | 4.860588885693231e−3 |
| 480 | 4.764720830452409e−3 |
| 481 | 4.666469548192818e−3 |
| 482 | 4.565946029127366e−3 |
| 483 | 4.463150894014690e−3 |
| 484 | 4.358150755039186e−3 |
| 485 | 4.250967471708103e−3 |
| 486 | 4.141634861746089e−3 |
| 487 | 4.030165355928349e−3 |
| 488 | 3.916597675997815e−3 |
| 489 | 3.800994685405442e−3 |
| 490 | 3.683451012833619e−3 |
| 491 | 3.563914929838276e−3 |
| 492 | 3.442490007998456e−3 |
| 493 | 3.319256438897666e−3 |
| 494 | 3.194250476422174e−3 |
| 495 | 3.067525877056119e−3 |
| 496 | 2.939139106182801e−3 |
| 497 | 2.809151898728351e−3 |
| 498 | 2.677703006241942e−3 |
| 499 | 2.544830774162231e−3 |
| 500 | 2.410617950987095e−3 |
| 501 | 2.275190768887402e−3 |
| 502 | 2.138586519570023e−3 |
| 503 | 2.000881763033976e−3 |
| 504 | 1.862161137529843e−3 |
| 505 | 1.722850651410707e−3 |
| 506 | 1.583005323492318e−3 |
| 507 | 1.442635273572746e−3 |
| 508 | 1.301735673138880e−3 |
| 509 | 1.160531184883257e−3 |
| 510 | 1.018710154718430e−3 |
| 511 | 8.753658738743612e−4 |
| 512 | 7.250868879948704e−4 |
| 513 | 5.901514303345345e−4 |
| 514 | 4.571251178344833e−4 |
| 515 | 3.254504484897777e−4 |
| 516 | 1.951832637892118e−4 |
| 517 | 6.661818101906931e−5 |
| 518 | −6.002729636107936e−5 |
| 519 | −1.845163192347697e−4 |
| 520 | −3.065712811761140e−4 |
| 521 | −4.259661821125124e−4 |
| 522 | −5.424773586381941e−4 |
| 523 | −6.558084462274315e−4 |
| 524 | −7.659101269870789e−4 |
| 525 | −8.724859431432570e−4 |
| 526 | −9.753531169034512e−4 |
| 527 | −1.074300123306481e−3 |
| 528 | −1.169143931350576e−3 |
| 529 | −1.259725653234229e−3 |
| 530 | −1.345834916989234e−3 |
| 531 | −1.427339710937440e−3 |
| 532 | −1.504079803740054e−3 |
| 533 | −1.575880973843057e−3 |
| 534 | −1.642633580824677e−3 |
| 535 | −1.704200291375062e−3 |
| 536 | −1.760514312756149e−3 |
| 537 | −1.811458673156579e−3 |
| 538 | −1.856981580032126e−3 |
| 539 | −1.897029046447624e−3 |
| 540 | −1.931585942699363e−3 |
| 541 | −1.960627084932276e−3 |
| 542 | −1.984178530495641e−3 |
| 543 | −2.002288840866127e−3 |
| 544 | −2.014916352347506e−3 |
| 545 | −2.022189226793424e−3 |
| 546 | −2.024254777335021e−3 |
| 547 | −2.021156706871573e−3 |
| 548 | −2.013111787438794e−3 |
| 549 | −2.000212633130633e−3 |
| 550 | −1.982687042477966e−3 |
| 551 | −1.960693892404943e−3 |
| 552 | −1.934407806173517e−3 |
| 553 | −1.904123563599214e−3 |
| 554 | −1.870072199436830e−3 |
| 555 | −1.832519954023970e−3 |
| 556 | −1.791756667369466e−3 |
| 557 | −1.747978720577777e−3 |
| 558 | −1.701541033746949e−3 |
| 559 | −1.652689459435072e−3 |
| 560 | −1.601690868666912e−3 |
| 561 | −1.548954090992685e−3 |
| 562 | −1.494709797773535e−3 |
| 563 | −1.439190571857024e−3 |
| 564 | −1.382763830841281e−3 |
| 565 | −1.325642967049430e−3 |
| 566 | −1.268184236874211e−3 |
| 567 | −1.210596701555163e−3 |
| 568 | −1.153025111297160e−3 |
| 569 | −1.095962010293130e−3 |
| 570 | −1.039553843860894e−3 |
| 571 | −9.838346246983619e−4 |
| 572 | −9.290281181623759e−4 |
| 573 | −8.749810533387956e−4 |
| 574 | −8.215803921619577e−4 |
| 575 | −7.706114369075383e−4 |
| 576 | −7.240453976226097e−4 |
| 577 | −6.849432723864428e−4 |
| 578 | −6.499492788836954e−4 |
| 579 | −6.169265465797999e−4 |
| 580 | −5.864023580206857e−4 |
| 581 | −5.585564628691223e−4 |
| 582 | −5.332623456777386e−4 |
| 583 | −5.106711356117643e−4 |
| 584 | −4.907668696713635e−4 |

TABLE 1-continued

Coefficients of a 64 channel low delay prototype filter

| n | $P_0(n)$ |
|---|---|
| 585 | −4.734587422398502e−4 |
| 586 | −4.585871522474066e−4 |
| 587 | −4.460035977692689e−4 |
| 588 | −4.356377129231574e−4 |
| 589 | −4.273247732616044e−4 |
| 590 | −4.208333621911742e−4 |
| 591 | −4.159437129295563e−4 |
| 592 | −4.123958508631197e−4 |
| 593 | −4.100224176114866e−4 |
| 594 | −4.085466400930828e−4 |
| 595 | −4.077080867389932e−4 |
| 596 | −4.073254606881664e−4 |
| 597 | −4.070933269997811e−4 |
| 598 | −4.067607615013048e−4 |
| 599 | −4.061488056951641e−4 |
| 600 | −4.050555465493161e−4 |
| 601 | −4.033838274959328e−4 |
| 602 | −4.008810861049167e−4 |
| 603 | −3.973769462134710e−4 |
| 604 | −3.928186163645286e−4 |
| 605 | −3.870561868619109e−4 |
| 606 | −3.799993669990150e−4 |
| 607 | −3.715971708042990e−4 |
| 608 | −3.617549303005874e−4 |
| 609 | −3.505340232816606e−4 |
| 610 | −3.378810708512397e−4 |
| 611 | −3.237820254163679e−4 |
| 612 | −3.083797394566325e−4 |
| 613 | −2.916580376245428e−4 |
| 614 | −2.737128656378774e−4 |
| 615 | −2.546626898474145e−4 |
| 616 | −2.344785058384558e−4 |
| 617 | −2.134575242388197e−4 |
| 618 | −1.916264055195752e−4 |
| 619 | −1.692851860592005e−4 |
| 620 | −1.466953561242506e−4 |
| 621 | −1.236855725370398e−4 |
| 622 | −1.005737421222391e−4 |
| 623 | −7.750656629326379e−5 |
| 624 | −5.466984383016220e−5 |
| 625 | −3.255925659037227e−5 |
| 626 | −1.096860208856302e−5 |
| 627 | 9.881411051921578e−6 |
| 628 | 2.951496818998434e−5 |
| 629 | 4.810106298036608e−5 |
| 630 | 6.513783951460106e−5 |
| 631 | 8.051456871678129e−5 |
| 632 | 9.429776656872437e−5 |
| 633 | 1.058298511976110e−4 |
| 634 | 1.155823148740170e−4 |
| 635 | 1.229659417867084e−4 |
| 636 | 1.266886375085138e−4 |
| 637 | 1.279376783418106e−4 |
| 638 | 1.216914974923773e−4 |
| 639 | 9.386301157644215e−5 |

Figure 5:
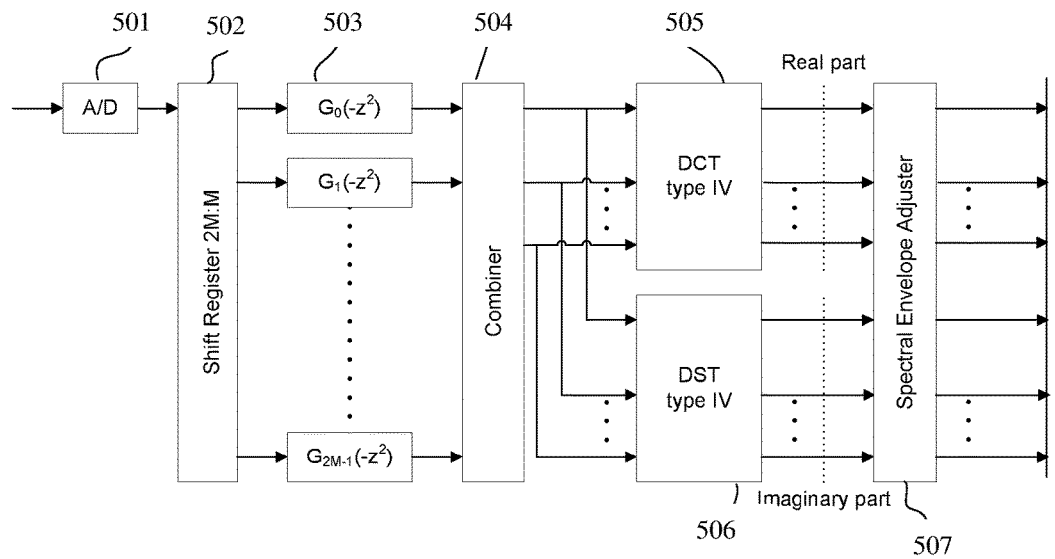
FIG. 5 illustrates an example of the analysis and synthesis parts of a low delay complex-exponential modulated filter bank system.
Figure 5:
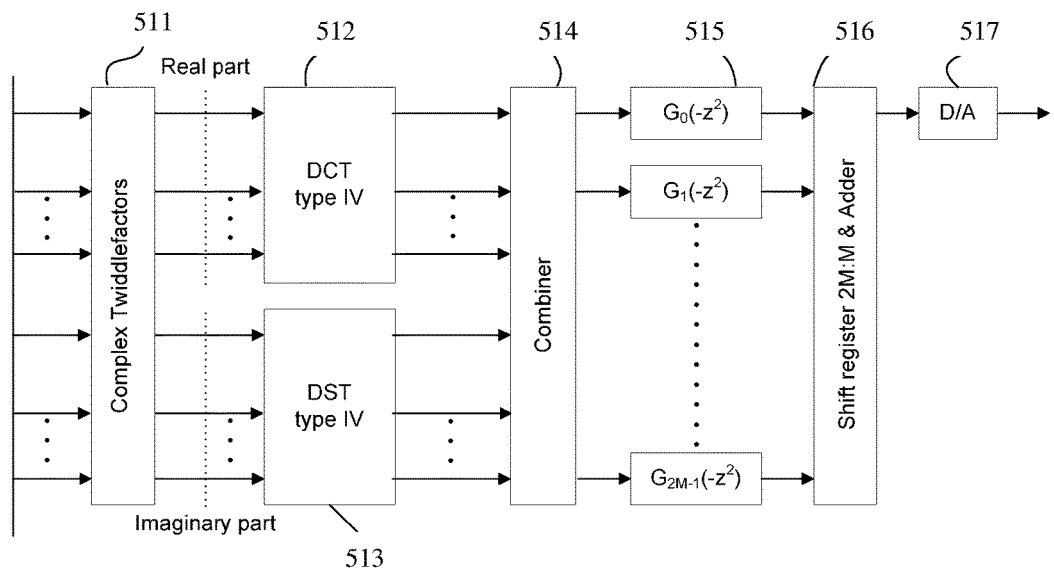

In the following, different aspects of practical implementations are outlined. Using a standard PC or DSP, real-time operation of a low delay complex-exponential modulated filter bank is possible. The filter bank may also be hard-coded on a custom chip. FIG. 5(a) shows the structure for an effective implementation of the analysis part of a complex-exponential modulated filter bank system. The analogue input signal is first fed to an A/D converter 501. The digital time domain signal is fed to a shift register holding 2M samples shifting M samples at a time 502. The signals from the shift register are then filtered through the poly-phase coefficients of the prototype filter 503. The filtered signals are subsequently combined 504 and in parallel transformed with a DCT-IV 505 and a DST-IV 506 transform. The outputs from the cosine and sine transforms constitute the real and the imaginary parts of the subband samples respectively. The gains of the subband samples are modified according to the current spectral envelope adjuster setting 507.

An effective implementation of the synthesis part of a low delay complex-exponential modulated system is shown in FIG. 5(b). The subband samples are first multiplied with complex-valued twiddle-factors, i.e. complex-valued channel dependent constants, 511, and the real part is modulated with a DCT-IV 512 and the imaginary part with a DST-IV 513 transform. The outputs from the transforms are combined 514 and fed through the poly-phase components of the prototype filter 515. The time domain output signal is obtained from the shift register 516. Finally, the digital output signal is converted back to an analogue waveform 517.

While the above outlined implementations use DCT and DST type IV transforms, implementations using DCT type II and III kernels are equally possible (and also DST type II and III based implementations). However, the most computationally efficient implementations for complex-exponential modulated banks use pure FFT kernels. Implementations using a direct matrix-vector multiplication are also possible but are inferior in efficiency.

In summary, the present document describes a design method for prototype filters used in analysis/synthesis filter banks. Desired properties of the prototype filters and the resulting analysis/synthesis filter banks are near perfect reconstruction, low delay, low sensitivity to aliasing and minimal amplitude/phase distortion. An error function is proposed which may be used in an optimization algorithm to determine appropriate coefficients of the prototype filters. The error function comprises a set of parameters that may be tuned to modify the emphasis between the desired filter properties. Preferably, asymmetric prototype filters are used. Furthermore, a prototype filter is described which provides a good compromise of desired filter properties, i.e. near perfect reconstruction, low delay, high resilience to aliasing and minimal phase/amplitude distortion.

While specific embodiments and applications have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

The filter design method and system as well as the filter bank described in the present document may be implemented as software, firmware and/or hardware. Certain components may e.g. be implemented as software running on a digital signal processor or microprocessor. Other component may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the Internet. Typical devices making use of the filter banks described in the present document are set-top boxes or other customer premises equipment which decode audio signals. On the encoding side, the filter banks may be used in broadcasting stations, e.g. in video headend systems.

The invention claimed is:

1. An apparatus for generating real-valued output audio samples, the apparatus comprising:

memory that stores complex-valued input subband samples, real-valued demodulated samples, and the real-valued output audio samples;

a phase shifter that shifts a phase of the complex-valued input subband samples by an amount equal to a previously added phase shift; and a complex-valued synthesis filter bank that generates the real-valued output audio samples in response to the complex-valued input subband samples, the real-valued demodulated samples, and prototype filter coefficients, wherein the complex-valued synthesis filter bank:

shifts a first subset of the real-valued demodulated samples in the memory;

multiplies the complex-valued input subband samples by a complex-valued exponential modulation matrix to generate complex-valued demodulated samples;

stores the real part of the complex-valued demodulated samples in the memory as a second subset of the real-valued demodulated samples;

extracts a third subset of the real-valued demodulated samples from the memory;

multiplies the third subset of the real-valued demodulated samples by the prototype filter coefficients to generate windowed samples;

combines the windowed samples to generate the real-valued output audio samples; and stores the real-valued output audio samples in the memory.

2. The apparatus of claim 1 wherein the prototype filter coefficients represent an asymmetric low-pass prototype filter or a symmetric low-pass prototype filter.

3. The apparatus of claim 1 wherein the real-valued demodulated samples are shifted by 128 positions in the memory.

4. The apparatus of claim 1 wherein the third subset of the real-valued demodulated samples comprises an array of 640 elements.

5. The apparatus of claim 1 wherein the complex-valued synthesis filter bank is a QMF filter bank.

6. The apparatus of claim 1 wherein the real-valued output audio samples are time domain audio samples.

7. The apparatus of claim 1 wherein the complex-valued synthesis filter bank is part of a high frequency reconstruction (HFR) module that reconstructs high frequency components of the audio signal.

8. The apparatus of claim 1 wherein the memory comprises a collective memory of an audio decoder.

9. The apparatus of claim 1 wherein the real-valued output audio samples comprise an array of 64 samples.

10. A method for generating real-valued output audio samples, the method comprising:

storing complex-valued input subband samples in a memory;

shifting a phase of the complex-valued input subband samples by an amount equal to a previously added phase shift;

generating the real-valued output audio samples in response to the complex-valued input subband samples, real-valued demodulated samples, and prototype filter coefficients using a complex-valued synthesis filter bank; and storing the real-valued output audio samples in the memory, wherein the complex-valued synthesis filter bank:

shifts a first subset of the real-valued demodulated samples in the memory;

multiplies the complex-valued input subband samples by a complex-valued exponential modulation matrix to generate complex-valued demodulated samples;

stores the real part of the complex-valued demodulated samples in the memory as a second subset of the real-valued demodulated samples;

extracts a third subset of the real-valued demodulated samples from the memory;

multiplies the third subset of the real-valued demodulated samples by the prototype filter coefficients to generate windowed samples;

combines the windowed samples to generate the real-valued output audio samples; and stores the real-valued output audio samples in the memory.

11. The method of claim 10 wherein the prototype filter coefficients represent an asymmetric low-pass prototype filter or a symmetric low-pass prototype filter.

12. The method of claim 10 wherein the real-valued demodulated samples are shifted by 128 positions in the memory.

13. The method of claim 10 wherein the third subset of the real-valued demodulated samples comprises an array of 640 elements.

14. The apparatus of claim 10 wherein the real-valued output audio samples are time domain audio samples.

15. The method of claim 10 wherein the complex-valued low delay synthesis filter bank is used as part of a high frequency reconstruction (HFR) process for reconstructing high frequency components of the audio signal.

16. The method of claim 10 wherein the complex-valued low delay synthesis filter bank is a QMF filter bank.

17. The apparatus of claim 10 wherein the real-valued output audio samples comprise an array of 64 samples.

18. The apparatus of claim 10 wherein the memory comprises a collective memory of an audio decoder.

* * * * *